United States Patent
Chae et al.

(10) Patent No.: US 11,871,601 B2
(45) Date of Patent: Jan. 9, 2024

(54) DISPLAY APPARATUS

(71) Applicant: Samsung Display Co., Ltd., Yongin-si (KR)

(72) Inventors: Jongwon Chae, Yongin-si (KR); Moosoon Ko, Yongin-si (KR); Raeyoung Gwak, Yongin-si (KR); Sunghoon Moon, Yongin-si (KR); Sewan Son, Yongin-si (KR); Yongje Jeon, Yongin-si (KR); Jingoo Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 142 days.

(21) Appl. No.: 17/074,370

(22) Filed: Oct. 19, 2020

(65) Prior Publication Data

US 2021/0184155 A1    Jun. 17, 2021

(30) Foreign Application Priority Data

Dec. 11, 2019    (KR) ..................... 10-2019-0164800

(51) Int. Cl.
*H10K 59/121*    (2023.01)
*H10K 50/84*    (2023.01)
(Continued)

(52) U.S. Cl.
CPC ......... *H10K 50/841* (2023.02); *H10K 50/824* (2023.02); *H10K 59/121* (2023.02);
(Continued)

(58) Field of Classification Search
CPC ............. H01L 27/3216; H01L 27/3218; H01L 27/3227; H01L 27/3234; H01L 27/3269; H01L 27/3272; H10K 59/10–65
See application file for complete search history.

(56) References Cited

U.S. PATENT DOCUMENTS 10,756,136 B1 *   8/2020 Ma ..................... H01L 31/147
2014/0183479 A1   7/2014 Park et al.
(Continued)

FOREIGN PATENT DOCUMENTS

CN    108269502 A    7/2018
CN    209056269 U    7/2019
(Continued)

OTHER PUBLICATIONS

EPO Extended European Search Report dated Mar. 18, 2021, issued in corresponding European Patent Application No. 20198029.9 (11 pages).

*Primary Examiner* — Bryan R Junge
(74) *Attorney, Agent, or Firm* — Lewis Roca Rothgerber Christie LLP

(57) ABSTRACT

A display apparatus includes: a substrate; a first display area at which a plurality of main sub-pixels are on the substrate; and a second display area at which a base unit is on the substrate, the base unit comprising a plurality of pixel groups including auxiliary sub-pixels and transmission portions, wherein the pixel groups and the transmission portions are alternately arranged along a first direction, and auxiliary sub-pixels included in one pixel group among the pixel groups are provided in two rows, and a size of an emission area of a first auxiliary sub-pixel among the auxiliary sub-pixels is greater than a size of an emission area of a first main sub-pixel exhibiting a same color as that of the first auxiliary sub-pixel among the main sub-pixels.

20 Claims, 14 Drawing Sheets

(51) Int. Cl.
*H10K 50/824* (2023.01)
*H10K 59/122* (2023.01)
*H10K 59/123* (2023.01)
*H10K 59/124* (2023.01)
*H10K 59/35* (2023.01)

(52) U.S. Cl.
CPC ......... *H10K 59/122* (2023.02); *H10K 59/123* (2023.02); *H10K 59/124* (2023.02); *H10K 59/352* (2023.02); *H10K 59/353* (2023.02)

(56) References Cited

U.S. PATENT DOCUMENTS

| | | | |
|---|---|---|---|
| 2014/0183484 A1* | 7/2014 | Moon | H01L 27/3216 |
| | | | 257/40 |
| 2016/0064458 A1 | 3/2016 | Lee et al. | |
| 2016/0141353 A1* | 5/2016 | Kim | H10K 59/353 |
| | | | 257/773 |
| 2016/0254495 A1 | 9/2016 | Amano et al. | |
| 2016/0293687 A1* | 10/2016 | Chang | H01L 27/326 |
| 2018/0143669 A1 | 5/2018 | Bok et al. | |
| 2018/0247985 A1 | 8/2018 | Jeon et al. | |
| 2019/0130822 A1 | 5/2019 | Jung et al. | |
| 2019/0212788 A1 | 7/2019 | Kwak et al. | |
| 2019/0326366 A1* | 10/2019 | Fan | H10K 59/35 |
| 2020/0066809 A1* | 2/2020 | Liu | G09G 3/3225 |
| 2020/0135148 A1* | 4/2020 | Bai | G09G 3/20 |
| 2020/0227488 A1* | 7/2020 | Xin | H10K 59/353 |
| 2020/0312832 A1* | 10/2020 | Chi | H10K 59/353 |
| 2020/0403043 A1* | 12/2020 | Xin | H10K 59/122 |
| 2020/0411607 A1* | 12/2020 | Jian | H10K 59/60 |
| 2021/0013277 A1* | 1/2021 | Liu | H10K 59/122 |
| 2021/0065625 A1* | 3/2021 | Wang | G09G 3/3233 |
| 2021/0141304 A1* | 5/2021 | Liu | G03F 1/38 |
| 2021/0143229 A1* | 5/2021 | Feng | H10K 59/352 |
| 2021/0159286 A1* | 5/2021 | Ma | H10K 59/126 |
| 2021/0248945 A1* | 8/2021 | Liu | G09G 3/20 |
| 2021/0265430 A1* | 8/2021 | Chang | H10K 59/353 |
| 2021/0366933 A1* | 11/2021 | Zhang | H01L 29/78633 |
| 2021/0376011 A1* | 12/2021 | Liu | H10K 59/121 |

FOREIGN PATENT DOCUMENTS

| | | |
|---|---|---|
| CN | 209265332 U | 8/2019 |
| KR | 10-2017-0113066 A | 10/2017 |
| KR | 10-2018-0057796 A | 5/2018 |
| KR | 10-2019-0084397 A | 7/2019 |
| TW | 201939733 A | 10/2019 |

* cited by examiner

FIG. 12

| | EXAMPLE 1 | COMPARATIVE EXAMPLE | EXAMPLE 2 |
|---|---|---|---|
| VISIBILITY | | | |
| LIFESPAN | 720hr | 320hr | 485hr |

DISPLAY APPARATUS

CROSS-REFERENCE TO RELATED APPLICATION

This application claims priority to and the benefit of Korean Patent Application No. 10-2019-0164800, filed on Dec. 11, 2019, in the Korean Intellectual Property Office, the disclosure of which is incorporated herein in its entirety by reference.

BACKGROUND

1. Field

Aspects of one or more example embodiments relate to a display apparatus.

2. Description of Related Art

Recently, the applications of display apparatuses have diversified. As display apparatuses have become slimmer and lighter with the progression of technology, their range of use has widened.

As display apparatuses are being used in various ways, the shapes of the display apparatuses may be designed in various ways and the functions capable of being associated with or connected to the display apparatuses are increasing.

The above information disclosed in this Background section is only for enhancement of understanding of the background and therefore the information discussed in this Background section does not necessarily constitute prior art.

SUMMARY

Aspects of one or more example embodiments include a display apparatus including a first display area which is a main display area and a second display area in which components or the like may be arranged therebelow. However, this is merely an example, and the scope of embodiments according to the present disclosure is not limited thereby.

Additional aspects will be set forth in part in the description which follows and, in part, will be more apparent from the description, or may be learned by practice of the presented example embodiments of the disclosure.

According to one or more example embodiments, a display apparatus includes: a substrate, a first display area in which main sub-pixels are arranged on the substrate, and a second display area in which a base unit is arranged on the substrate, the base unit including pixel groups including auxiliary sub-pixels and transmission portions, wherein the pixel groups and the transmission portions are alternately arranged in a first direction, and auxiliary sub-pixels included in one pixel group among the pixel groups are provided in two rows, and a size of an emission area of a first auxiliary sub-pixel among the auxiliary sub-pixel is greater than a size of an emission area of a first main sub-pixel exhibiting a same color as that of the first auxiliary sub-pixel among the main sub-pixels.

According to some example embodiments, the number of auxiliary sub-pixels included in the one pixel group among the pixel groups may be three, and each of the auxiliary sub-pixels may be arranged at a vertex of a virtual triangle.

According to some example embodiments, the number of auxiliary sub-pixels included in the base unit may be $3/8$ of the number of main sub-pixels included in a corresponding unit having the same area as that of the base unit in the first display area.

According to some example embodiments, the one pixel group and the two transmission portions may be arranged in a second direction intersecting the first direction.

According to some example embodiments, the number of auxiliary sub-pixels included in the one pixel group among the pixel groups may be four, and each of the auxiliary sub-pixels may be arranged at a vertex of a virtual rectangle.

According to some example embodiments, the virtual rectangle is a parallelogram.

According to some example embodiments, the number of auxiliary sub-pixels included in the base unit may be $1/4$ of the number of main sub-pixels included in a corresponding unit having the same area as that of the base unit in the first display area.

According to some example embodiments, the pixel groups may be apart from each other in the base unit.

According to some example embodiments, the transmission portions may each have a circular shape According to some example embodiments, opposite electrodes integrally provided in the main sub-pixels and the auxiliary sub-pixels may be arranged in the first display area and the second display area, and the opposite electrodes may each include an opening corresponding to one of the transmission portions.

According to some example embodiments, the display apparatus may further include an inorganic insulating layer arranged on the substrate, and the inorganic insulating layer may include openings corresponding to the transmission portions.

According to some example embodiments, the display apparatus may further include a lower electrode layer arranged between the substrate and the auxiliary sub-pixels, and the lower electrode layer may include lower holes corresponding to the transmission portions.

According to one or more example embodiments, a display apparatus includes: a substrate including a first display area in which main sub-pixels are provided and a second display area in which a pixel group including auxiliary sub-pixels and a transmission portion are provided, a first pixel electrode and a first emission layer, each configured to implement a first main sub-pixel among the main sub-pixels, a second pixel electrode and a second emission layer, each configured to implement a first auxiliary sub-pixel exhibiting the same color as that of the first main sub-pixel among the auxiliary sub-pixels, and an opposite electrode integrally arranged in the first display area and the second display area, wherein the auxiliary sub-pixels included in the pixel group are provided in two rows, and a size of an emission area of the first auxiliary sub-pixel is greater than a size of an emission area of the first main sub-pixel.

According to some example embodiments, the display apparatus may further include a functional layer arranged between the first pixel electrode and the opposite electrode, and the functional layer may be arranged to correspond to the transmission portion.

According to some example embodiments, the display apparatus may further include a lower electrode layer arranged between the substrate and the second pixel electrode, and the lower electrode layer may include lower holes corresponding to the transmission portions.

According to some example embodiments, the display apparatus may further include a pixel defining layer including a first opening and a second opening configured to expose central portions of the first pixel electrode and the second pixel electrode, respectively, the emission area of the first main sub-pixel may be defined by the first opening, and the emission area of the first auxiliary sub-pixel may be defined by the second opening.

According to some example embodiments, the display apparatus may further include an inorganic insulating layer arranged on the substrate, and the inorganic insulating layer may include openings corresponding to the transmission portions.

According to some example embodiments, the first display area and the second display area may be sealed by an encapsulation substrate arranged to face the substrate.

According to some example embodiments, the display apparatus may further include a thin-film encapsulation layer including a first inorganic encapsulation layer, an organic encapsulation layer, and a second inorganic encapsulation layer, which are sequentially arranged on the opposite electrode.

According to some example embodiments, the display apparatus may further include an image sensor arranged below the second display area.

BRIEF DESCRIPTION OF THE DRAWINGS

The above and other aspects, features, and characteristics of certain example embodiments of the disclosure will be more apparent from the following description taken in conjunction with the accompanying drawings, in which:

FIG. 12 is a table showing visibility and lifespan according to some example embodiments and a comparative example.

DETAILED DESCRIPTION

Figure 1:
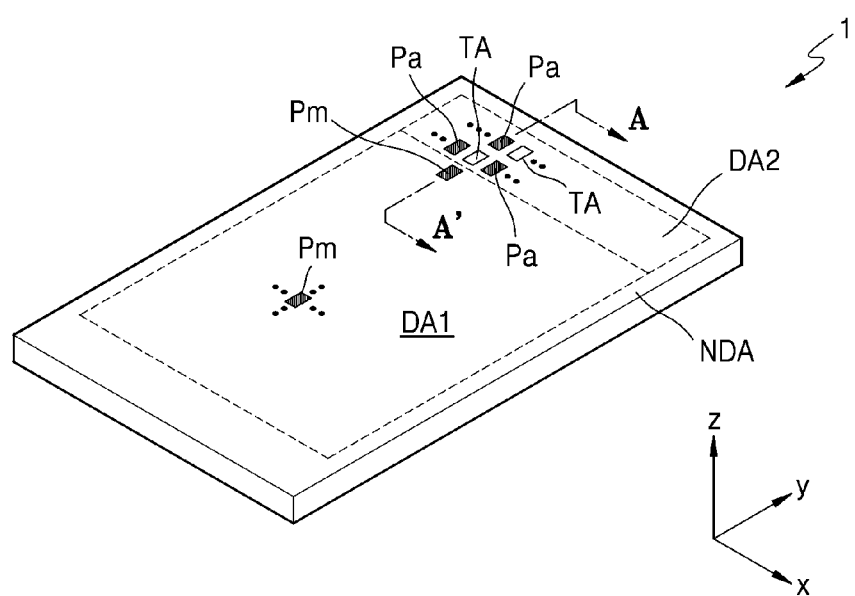
FIG. 1 is a schematic perspective view of a display apparatus according to some example embodiments.

Reference will now be made in more detail to aspects of some example embodiments, which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of some example embodiments according to the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, aspects of some example embodiments will be described in more detail with reference to the accompanying drawings. When describing example embodiments with reference to the accompanying drawings, the same or corresponding elements are denoted by the same reference numerals and a redundant description thereof will be omitted.

It will be understood that although the terms "first," "second," etc. may be used herein to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that terms such as "comprise," "include," and "have" used herein specify the presence of stated features or elements, but do not preclude the presence or addition of one or more other features or elements.

It will be understood that when a layer, region, or element is referred to as being "on" another layer, region, or element, it may be "directly on" the other layer, region, or element or may be "indirectly on" the other layer, region, or element with one or more intervening layers, regions, or elements therebetween.

Sizes of components in the drawings may be exaggerated for convenience of description. In other words, since the sizes and thicknesses of elements in the drawings are arbitrarily illustrated for convenience of description, the following embodiments are not limited thereto.

In the following example embodiments, it will be understood that when a film, layer, region, element, or component is referred to as being "connected to" or "coupled to" another film, layer, region, element, and component, it may be directly or indirectly connected or coupled to the other film, layer, region, element, or component. That is, for example, intervening films, regions, or components may be present. In the following embodiments, it will be understood that when a film, layer, region, element, or component is referred to as being "electrically connected to" or "electrically coupled to" another film, layer, region, element, and component, it may be directly or indirectly electrically connected or coupled to the other film, layer, region, element, or component. That is, for example, intervening films, layers, regions, elements, or components may be present.

FIG. 1 is a schematic perspective view of a display apparatus 1 according to some example embodiments.

Referring to FIG. 1, the display apparatus 1 may include a first display area DA1 at which images may be displayed or implemented and a non-display area NDA at which images are not displayed or implemented. The display apparatus 1 may provide or display a main image by using light emitted from a plurality of main sub-pixels Pm arranged in the first display area DA1. In the present specification, a sub-pixel refers to an area (e.g., having a display element) at which one color such as a red color, a green color, a blue color, or a white color is emitted and refers to a minimum unit constituting an image.

The display apparatus 1 may include a second display area DA2. As described in more detail below with reference to FIG. 2, the second display area DA2 may be an area at which a component such as a sensor using visible light, infrared light, or sound is arranged therebelow. The second display area DA2 may include transmission portions TA capable of transmitting light or/and sound output from the component to the outside or traveling toward the component from the outside or an external component. According to some example embodiments, when light transmits through the second display area DA2, the light transmittance may be about 30% or more, more preferably about 50% or more, about 75% or more, about 80% or more, about 85% or more, or about 90% or more.

According to some example embodiments, a plurality of auxiliary sub-pixels Pa may be arranged in the second display area DA2, and a certain image may be provided by using light emitted from the auxiliary sub-pixels Pa. An image provided in the second display area DA2 may be an auxiliary image and may have a resolution lower than that of an image provided in the first display area DA1. That is, because the second display area DA2 includes the transmission portions TA capable of transmitting light or/and sound, the number of auxiliary sub-pixels Pa arranged per unit area at the second display area DA2 may be less than the number of main sub-pixels Pm arranged per unit area in the first display area DA1.

The second display area DA2 may be arranged at one side of the first display area DA1. According to some example embodiments, FIG. 1 illustrates an embodiment in which the second display area DA2 is arranged above the first display area DA1 such that the second display area DA2 is arranged between the non-display area NDA and the first display area DA1. However, embodiments according to the present disclosure are not limited thereto. For example, the shape of the first display area DA1 may be a circle, an ellipse, or a polygon such as a triangle or a pentagon, and the second display area DA2 may be arranged inside the first display area DA1 and surrounded by the first display area DA1.

Hereinafter, although an organic light-emitting display apparatus is described as an example of the display apparatus 1 according to some example embodiments, the display apparatus according to embodiments of the present disclosure is not limited thereto. According to some example embodiments, various types of display apparatuses, such as an inorganic light-emitting display apparatus or a quantum dot light-emitting display apparatus, may be used.

Figure 2:
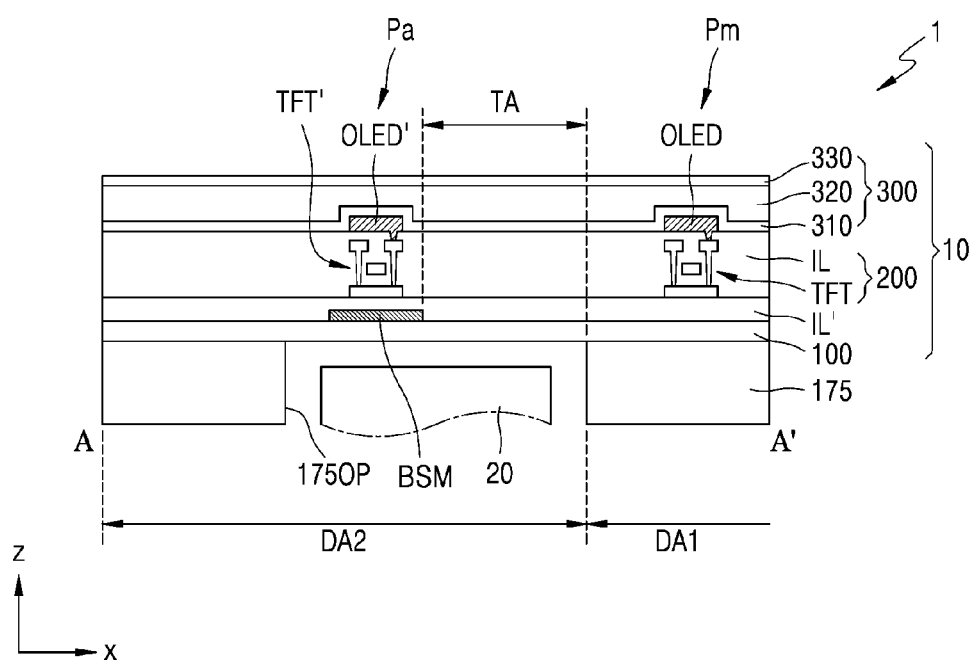
FIG. 2 is a schematic cross-sectional view of a display apparatus according to some example embodiments.

FIG. 2 is a cross-sectional view schematically illustrating a display apparatus 1 according to some example embodiments and may correspond to a cross-section taken along the line A-A' of FIG. 1.

Referring to FIG. 2, the display apparatus 1 may include a display panel 10 including a display element, and a component 20 corresponding to a second display area DA2.

The display panel 10 may include a substrate 100, a display element layer 200 arranged above the substrate 100, and a thin-film encapsulation layer 300 operating as a sealing member or encapsulant for sealing the display element layer 200, for example, to protect the display element layer 200 from external contaminants. In addition, the display panel 10 may further include a lower protective film 175 arranged below the substrate 100.

The substrate 100 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may have flexible, rollable, or bendable characteristics. The substrate 100 may have a multi-layered structure including an inorganic layer and a layer including the above-described polymer resin.

The display element layer 200 may include a circuit layer including first and second thin-film transistors TFT and TFT', first and second organic light-emitting diodes OLED and OLED' as the display element, and insulating layers IL and IL' therebetween.

A main sub-pixel Pm including the first thin-film transistor TFT and the first organic light-emitting diode OLED connected thereto may be arranged in the first display area DA1, and an auxiliary sub-pixel Pa including the second thin-film transistor TFT' and the second organic light-emitting diode OLED' connected thereto may be arranged in the second display area DA2.

In addition, a transmissive portion TA in which no display element is arranged may be arranged in the second display area DA2. The transmission portion TA may be understood as an area through which light or a signal emitted from the component 20 or light or a signal incident to the component 20 transmits or may be transmitted.

The component 20 may be located in the second display area DA2. The component 20 may be an electronic element using light or sound. For example, the component 20 may be an image sensor configured to capture an image, a camera, a sensor (e.g., an infrared sensor) configured to receive and use light, a sensor configured to output and detect light or sound so as to measure a distance, a sensor configured to recognize a fingerprint, a small lamp configured to output light, a speaker configured to output sound, and the like.

When the component 20 is an electronic element using light, the component 20 may use light of various wavelength bands, such as visible light, infrared light, and ultraviolet light. A plurality of components 20 may be arranged in the second display area DA2. For example, as the component 20, a light-emitting element and a light-receiving element may be provided together in the single second display area DA2. Alternatively, a light-emitting portion and a light-receiving portion may be simultaneously provided in the single component 20.

A lower electrode layer BSM may be arranged in the second display area DA2. The lower electrode layer BSM may be arranged to correspond to the lower portion of the second thin-film transistor TFT'. The lower electrode layer BSM may block external light from reaching the auxiliary sub-pixel Pa including the second thin-film transistor TFT' and the like. For example, the lower electrode layer BSM may block light emitted from the component 20 from reaching the auxiliary sub-pixel Pa.

In some example embodiments, a constant voltage or signal is applied to the lower electrode layer BSM to prevent damage to the pixel circuit due to electrostatic discharge.

The thin-film encapsulation layer 300 may include at least one inorganic encapsulation layer and at least one organic encapsulation layer. In this regard, first and second inorganic encapsulation layers 310 and 330 and an organic encapsulation layer 320 therebetween are illustrated in FIG. 2.

The first and second inorganic encapsulation layers 310 and 330 may each include one or more inorganic insulating materials selected from aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, polyimide, polyethylene, and the like.

The lower protective film 175 may be attached to the lower portion of the substrate 100 to support and protect the substrate 100. The lower protective film 175 may include an opening 1750P corresponding to the second display area DA2. Because the opening 1750P is provided in the lower protective film 175, the light transmittance of the second display area DA2 may be improved. The lower protective film 175 may include polyethylene terephthalate (PET) or polyimide (PI).

An area of the second display area DA2 may be greater than an area in which the component 20 is arranged. Therefore, an area of the opening 1750P provided in the lower protective film 175 may not match an area of the second display area DA2. For example, the area of the opening 1750P may be less than the area of the second display area DA2.

In addition, a plurality of components 20 may be arranged in the second display area DA2. The components 20 may have different functions. For example, one of the components 20 may be a camera, and another thereof may be an infrared sensor.

According to some example embodiments, elements such as an input sensing member configured to sense a touch input, a polarizer, a retarder, a color filter, an anti-reflection member including a black matrix, and a transparent window may be further arranged in the display panel 10.

Although the thin-film encapsulation layer 300 is used as the encapsulation member for sealing the display element layer 200 according to some example embodiments, embodiments according to the present disclosure are not limited thereto. For example, a sealing substrate that is bonded to the substrate 100 by a sealant or frit may be used as the member for sealing the display element layer 200.

Figure 3A:
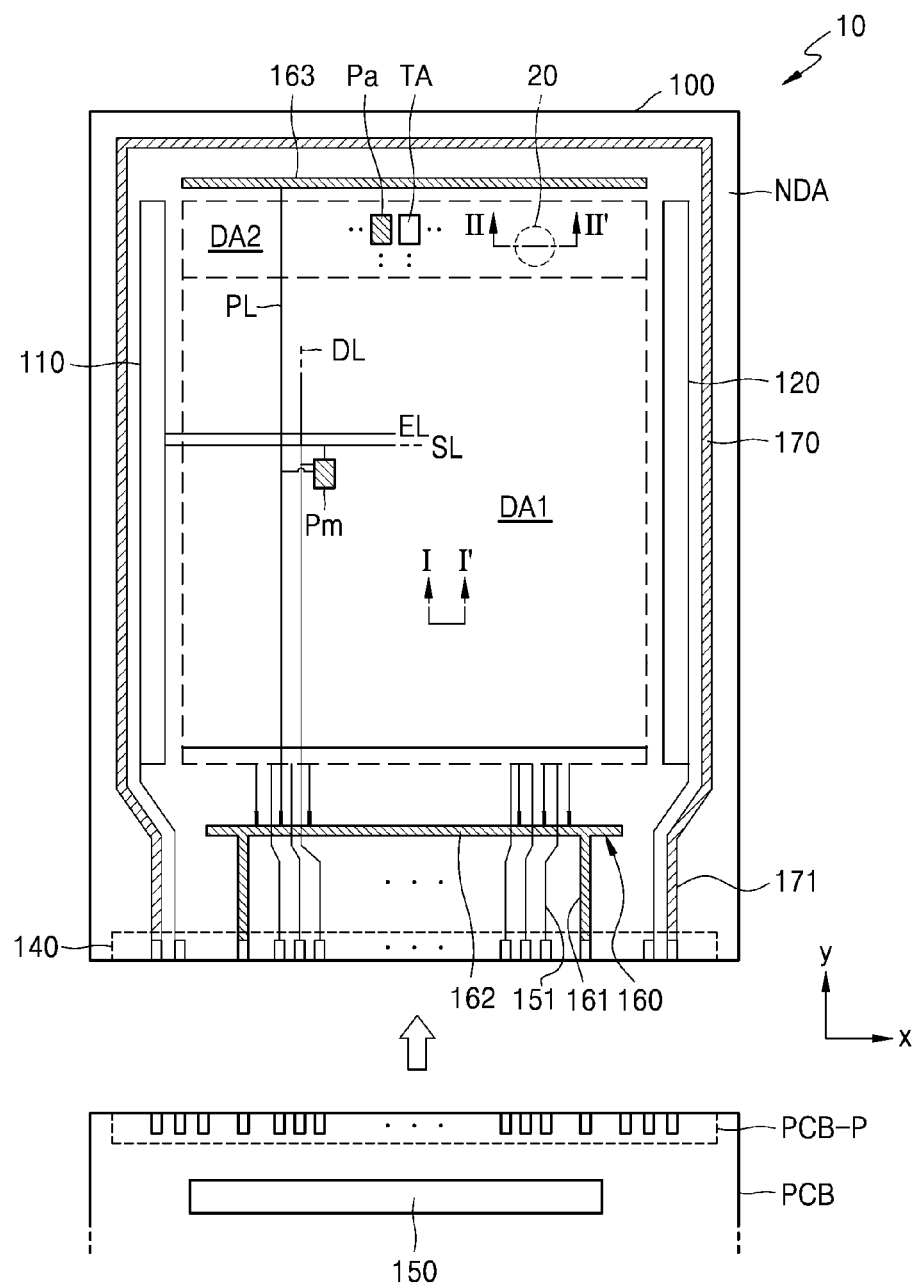
FIGS. 3A and 3B are schematic plan views of a display apparatus according to some example embodiments.

FIG. 3A is a schematic plan view of a display panel 10 according to some example embodiments.

Referring to FIG. 3A, the display panel 10 includes a plurality of main sub-pixels Pm arranged in a first display area DA1. The main sub-pixels Pm may be respectively implemented as display elements such as organic light-emitting diodes. Each of the main sub-pixels Pm may emit light of any one of a red color, a green color, a blue color, or a white color through the organic light-emitting diode. The first display area DA1 may be covered with the encapsulation member described above with reference to FIG. 2 and protected from external air, moisture, or the like.

A second display area DA2 may be arranged on one side of the first display area DA1, and a plurality of auxiliary sub-pixels Pa may be arranged in the second display area DA2. The auxiliary sub-pixels Pa may be respectively implemented as display elements such as organic light-emitting diodes. Each of the auxiliary sub-pixels Pa may emit light of any one of a red color, a green color, a blue color, or a white color through the organic light-emitting diode. A transmissive portion TA arranged between the auxiliary sub-pixels Pa may be arranged in the second display area DA2. At least one component 20 may be arranged to correspond to the lower portion of the second display area DA2 of the display panel 10.

According to some example embodiments, one main sub-pixel Pm and one auxiliary sub-pixel Pa may be driven by the same pixel circuit. However, embodiments according to the present disclosure are not limited thereto. The pixel circuit included in the main sub-pixel Pm and the pixel circuit configured to drive the auxiliary sub-pixel Pa may be different from each other. Because the second display area DA2 includes the transmissive portion TA, the resolution of the second display area DA2 may be less than the resolution of the first display area DA1.

The pixel circuits configured to drive the main sub-pixel Pm and the auxiliary sub-pixel Pa may be electrically connected to peripheral circuits arranged in the non-display area NDA. A first scan driving circuit 110, a second scan driving circuit 120, a terminal 140, a data driving circuit 150, a first power supply line 160, and a second power supply line 170 may be arranged in the non-display area NDA.

The first scan driving circuit 110 may provide a scan signal to each pixel circuit through a scan line SL. The first scan driving circuit 110 may provide an emission control signal to each pixel circuit through an emission control line EL. The second scan driving circuit 120 may be arranged in parallel with the first scan driving circuit 110, with the first display area DA1 therebetween. Some pixel circuits of the main sub-pixel Pm and the auxiliary sub-pixel Pa arranged in the first display area DA1 may be electrically connected to the first scan driving circuit 110, and the others thereof may be connected to the second scan driving circuit 120. According to some example embodiments, the second scan driving circuit 120 may be omitted.

The terminal 140 may be arranged on one side of the substrate 100. The terminal 140 may be exposed without being covered by an insulating layer and thus electrically connected to a printed circuit board PCB. A terminal PCB-P of the printed circuit board PCB may be electrically connected to the terminal 140 of the display panel 10. The printed circuit board PCB may transmit a signal or power of a controller (not illustrated) to the display panel 10. A control signal generated by the controller may be transmitted to the first and second scan driving circuits 110 and 120 through the printed circuit board PCB. The controller may provide first and second power supply voltages ELVDD and ELVSS (see FIGS. 4A and 4B to be described below) to the first and second power supply lines 160 and 170 through first and second connection lines 161 and 171, respectively. The first power supply voltage ELVDD may be provided to the pixel circuit configured to drive the main sub-pixel Pm and the auxiliary sub-pixel Pa through a driving voltage line PL connected to the first power supply line 160, and the second power supply voltage ELVSS may be provided to an opposite electrode of the organic light-emitting diode OLED connected to the second power supply line 170.

The data driving circuit 150 may be electrically connected to a data line DL. A data signal of the data driving circuit 150 may be provided to the pixel circuit configured to drive the main sub-pixel Pm and the auxiliary sub-pixel Pa through a connection line 151 connected to the terminal 140 and the data line DL connected to the connection line 151. FIG. 3 illustrates that the data driving circuit 150 is arranged on the printed circuit board PCB. However, according to some example embodiments, the data driving circuit 150 may be arranged on the substrate 100. For example, the data driving circuit 150 may be arranged between the terminal 140 and the first power supply line 160.

The first power supply line 160 may include a first sub-line 162 and a second sub-line 163 extending in parallel in an x direction, with the first display area DA1 therebetween. The second power supply line 170 may partially surround the first display area DA1 in a loop shape whose one side is opened.

Figure 3B:
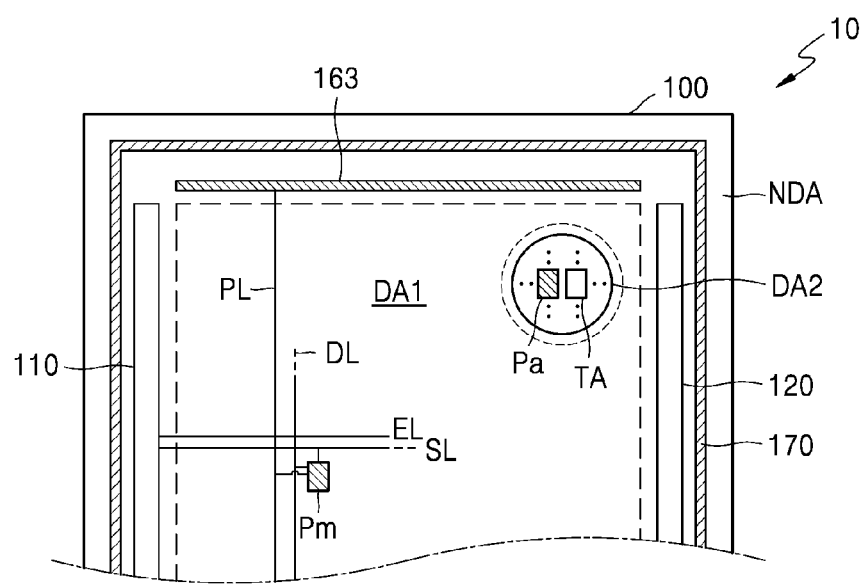

In FIG. 3A, the second display area DA2 is illustrated as being arranged on one side of the first display area DA1, but embodiments according to the present disclosure are not limited thereto. For example, as illustrated in FIG. 3B, the second display area DA2 may be provided as an area corresponding to a component arranged therebelow. In this case, the second display area DA2 may be arranged inside the first display area DA1 and may be surrounded by the first display area DA1.

Figure 4A:
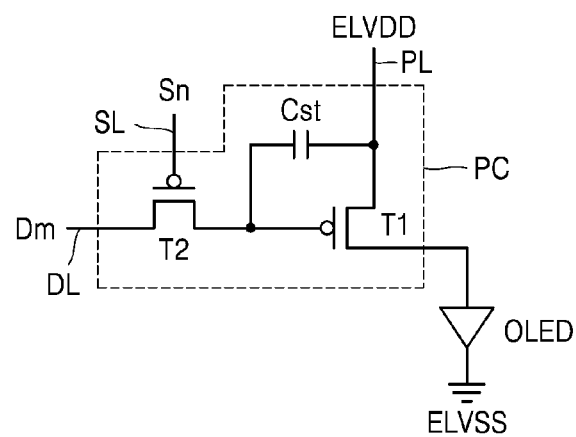
FIG. 4A is an equivalent circuit diagram of a pixel circuit that may be arranged in a display area and/or a sensor area of a display apparatus, according to some example embodiments.
Figure 4B:
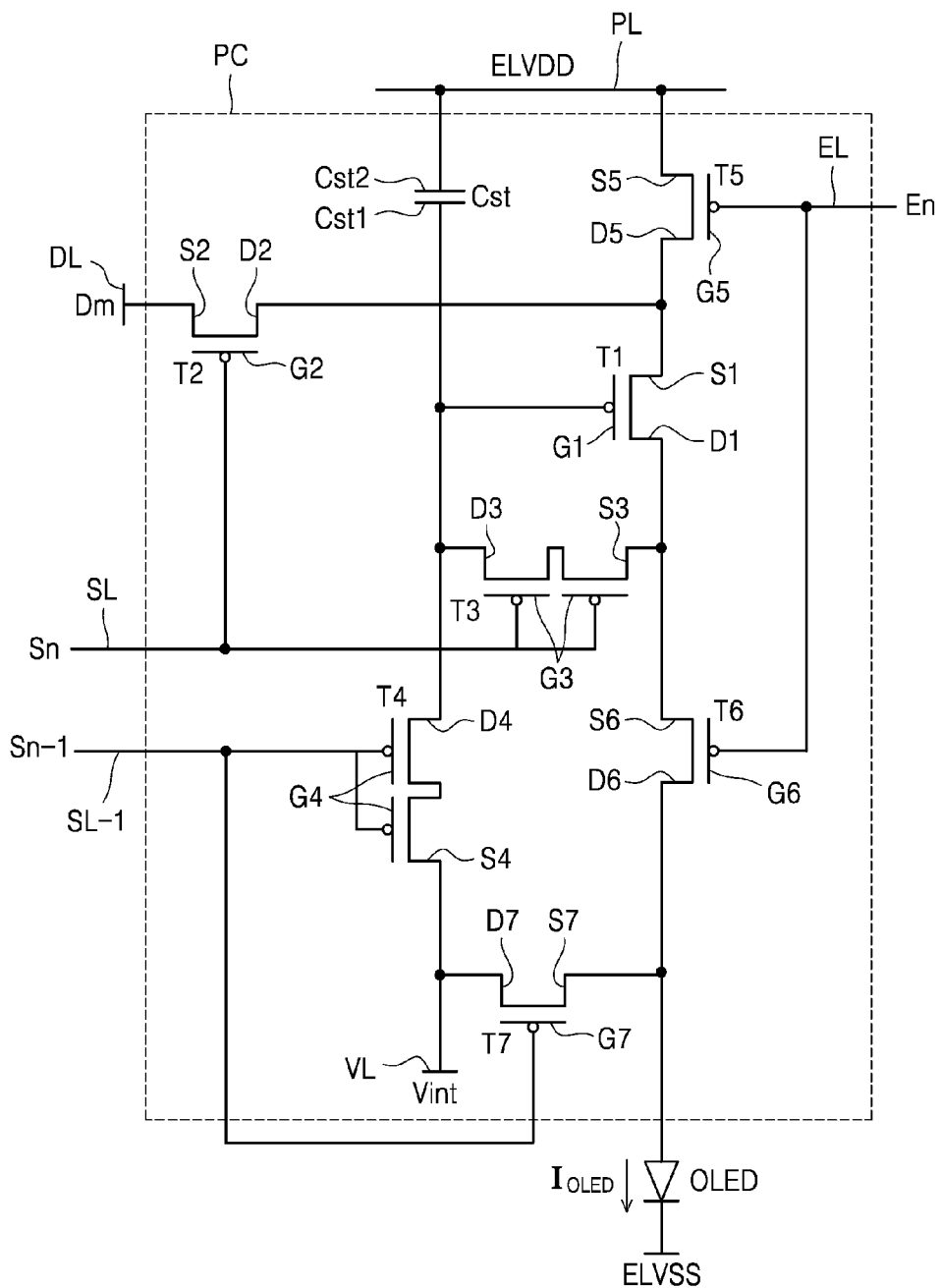
FIG. 4B is an equivalent circuit diagram of a pixel circuit that may be arranged in a display area and/or a sensor area of a display apparatus, according to some example embodiments.

FIGS. 4A and 4B are equivalent circuit diagrams of pixel circuits that may be included in a display panel, according to some example embodiments.

Referring to FIG. 4A, a pixel circuit PC may be connected to a scan line SL, a data line DL, a driving voltage line PL, and the like. The pixel circuit PC may be connected to an organic light-emitting diode OLED, which is a display element, and may drive the organic light-emitting diode. Therefore, the pixel circuit PC may implement each of sub-pixels Pm and Pa.

The pixel circuit PC may include a driving thin-film transistor T1, a switching thin-film transistor T2, and a storage capacitor Cst. The switching thin-film transistor T2 may be connected to the scan line SL and the data line DL and may be configured to transfer, to the driving thin-film transistor T1, a data signal Dm input through the data line DL according to a scan signal Sn input through the scan line SL.

The storage capacitor Cst may be connected to the switching thin-film transistor T2 and the driving voltage line PL and may be configured to store a voltage corresponding to a difference between a voltage received from the switching thin-film transistor T2 and a first power supply voltage ELVDD (or a driving voltage) supplied to the driving voltage line PL.

The driving thin-film transistor T1 may be connected to the driving voltage line PL and the storage capacitor Cst and may be configured to control a driving current flowing from the driving voltage line PL to the organic light-emitting diode OLED according to a voltage value stored in the storage capacitor Cst. The organic light-emitting diode OLED may emit light having a certain luminance according to the driving current.

A case in which the pixel circuit PC includes two thin-film transistors and one storage capacitor has been described with reference to FIG. 4A, but embodiments according to the present disclosure are not limited thereto. As illustrated in FIG. 4B, the pixel circuit PC may include seven thin-film transistors and one storage capacitor.

Referring to FIG. 4B, a pixel circuit PC may include a plurality of thin-film transistors and a storage capacitor. The thin-film transistors and the storage capacitor may be connected to signal lines SL, SL-1, EL, and DL, an initialization voltage line VL, and a driving voltage line PL.

The thin-film transistors may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

The signal lines may include a scan line SL configured to transfer a scan signal Sn, a previous scan line SL-1 configured to transfer a previous scan signal Sn-1 to the first initialization thin-film transistor T4 and the second initialization thin-film transistor T7, an emission control line EL configured to transfer an emission control signal En to the operation control thin-film transistor T5 and the emission control thin-film transistor T6, and a data line DL intersecting the scan line SL and configured to transfer a data signal Dm. The driving voltage line PL may be configured to transfer a driving voltage ELVDD to the driving thin-film transistor T1, and the initialization voltage line VL may be configured to transfer an initialization voltage Vint initializing the driving thin-film transistor T1 and a pixel electrode.

A driving gate electrode G1 of the driving thin-film transistor T1 may be electrically connected to a first electrode Cst1 of the storage capacitor Cst. A driving source electrode S1 of the driving thin-film transistor T1 may be electrically connected to the driving voltage line PL through the operation control thin-film transistor T5. A driving drain electrode D1 of the driving thin-film transistor T1 may be electrically connected to the pixel electrode of the organic light-emitting diode OLED through the emission control thin-film transistor T6. The driving thin-film transistor T1 may receive the data signal Dm according to a switching operation of the switching thin-film transistor T2 and supply a driving current IDLED to the organic light-emitting diode OLED.

A switching gate electrode G2 of the switching thin-film transistor T2 may be electrically connected to the scan line SL. A switching source electrode S2 of the switching thin-film transistor T2 may be electrically connected to the data line DL. A switching drain electrode D2 of the switching thin-film transistor T2 may be electrically connected to the driving source electrode S1 of the driving thin-film transistor T1 and electrically connected to the driving voltage line PL through the operation control thin-film transistor T5. The switching thin-film transistor T2 may be turned on according to the scan signal Sn received through the scan line SL and perform a switching operation to transfer the data signal Dm received through the data line DL to the driving source electrode S1 of the driving thin-film transistor T1.

A compensation gate electrode G3 of the compensation thin-film transistor T3 may be electrically connected to the scan line SL. A compensation source electrode S3 of the compensation thin-film transistor T3 may be electrically connected to the driving drain electrode D1 of the driving thin-film transistor T1 and electrically connected to the pixel electrode of the organic light-emitting diode OLED through the emission control thin-film transistor T6. A compensation drain electrode D3 of the compensation thin-film transistor T3 may be electrically connected to the first electrode Cst1 of the storage capacitor Cst, a first initialization drain electrode D4 of the first initialization thin-film transistor T4, and the driving gate electrode G1 of the driving thin-film transistor T1. The compensation thin-film transistor T3 may be turned on according to the scan signal Sn received through the scan line SL and electrically connect the driving gate electrode G1 of the driving thin-film transistor T1 to the driving drain electrode D1 of the driving thin-film transistor T1 to diode-connect the driving thin-film transistor T1.

A first initialization gate electrode G4 of the first initialization thin-film transistor T4 may be electrically connected to the previous scan line SL-1. A first initialization source electrode S4 of the first initialization thin-film transistor T4 may be electrically connected to a second initialization drain electrode D7 of the second initialization thin-film transistor T7 and the initialization voltage line VL. The first initialization drain electrode D4 of the first initialization thin-film transistor T4 may be electrically connected to the first electrode Cst1 of the storage capacitor Cst, the compensation drain electrode D3 of the compensation thin-film transistor T3, and the driving gate electrode G1 of the driving thin-film transistor T1. The first initialization thin-film transistor T4 may be turned on according to the previous scan signal Sn-1 received through the previous scan line SL-1 and perform an initialization operation to transfer the initialization voltage Vint to the driving gate electrode G1 of the driving thin-film transistor T1 to initialize the voltage of the driving gate electrode G1 of the driving thin-film transistor T1.

An operation control gate electrode G5 of the operation control thin-film transistor T5 may be electrically connected to the emission control line EL. An operation control source electrode S5 of the operation control thin-film transistor T5 may be electrically connected to the driving voltage line PL. An operation control drain electrode D5 of the operation control thin-film transistor T5 may be electrically connected to the driving source electrode S1 of the driving thin-film transistor T1 and the switching drain electrode D2 of the switching thin-film transistor T2.

An emission control gate electrode G6 of the emission control thin-film transistor T6 may be electrically connected to the emission control line EL. An emission control source electrode S6 of the emission control thin-film transistor T6 may be electrically connected to the driving drain electrode D1 of the driving thin-film transistor T1 and the compensation source electrode S3 of the compensation thin-film transistor T3. An emission control drain electrode D6 of the emission control thin-film transistor T6 may be electrically connected to a second initialization source electrode S7 of the second initialization thin-film transistor T7 and the pixel electrode of the organic light-emitting diode OLED.

The operation control thin-film transistor T5 and the emission control thin-film transistor T6 may be simultaneously turned on according to the emission control signal En received through the emission control line EL and transfer the driving voltage ELVDD to the main organic light-emitting diode OLED so that the driving current IDLED flows through the organic light-emitting diode OLED.

A second initialization gate electrode G7 of the second initialization thin-film transistor T7 may be electrically connected to the previous scan line SL-1. The second initialization source electrode S7 of the second initialization thin-film transistor T7 may be electrically connected to the emission control drain electrode D6 of the emission control thin-film transistor T6 and the pixel electrode of the organic light-emitting diode OLED. A second initialization drain electrode D7 of the second initialization thin-film transistor T7 may be electrically connected to the first initialization source electrode S4 of the first initialization thin-film transistor T4 and the initialization voltage line VL. The second initialization FT T7 may be turned on according to the previous scan signal Sn-1 received through the previous scan line SL-1 and initialize the pixel electrode of the organic light-emitting diode OLED.

FIG. 4B illustrates a case in which the first initialization thin-film transistor T4 and the second initialization thin-film transistor T7 are electrically connected to the previous scan line SL-1, but embodiments are not limited thereto. According to some example embodiments, the first initialization thin-film transistor T4 may be electrically connected to the previous scan line SL-1 and may be driven according to the previous scan signal Sn-1, and the second initialization thin-film transistor T7 may be electrically connected to a separate signal line (for example, a next scan line) and may be driven according to the signal received through the scan line.

A second electrode Cst2 of the storage capacitor Cst may be electrically connected to the driving voltage line PL, and the opposite electrode of the organic light-emitting diode OLED may be electrically connected to a common voltage ELVSS. Therefore, the organic light-emitting diode OLED may receive the driving current IDLED from the driving thin-film transistor T1 and emit light to display an image.

Each of the compensation thin-film transistor T3 and the first initialization thin-film transistor T4 is illustrated in FIG. 4B as having a dual gate electrode, but each of the compensation thin-film transistor T3 and the first initialization thin-film transistor T4 may have a single gate electrode.

According to some example embodiments, the main sub-pixel Pm and the auxiliary sub-pixel Pa may be implemented by the same pixel circuit PC. However, embodiments according to the present disclosure are not limited thereto. The main sub-pixel Pm and the auxiliary sub-pixel Pa may be implemented by pixel circuits PC having different structures. For example, the pixel circuit of FIG. 4B may be used as the pixel circuit that drives the main sub-pixel Pm, and the pixel circuit of FIG. 4A may be used as the pixel circuit that drives the auxiliary sub-pixel Pa.

Figure 5:
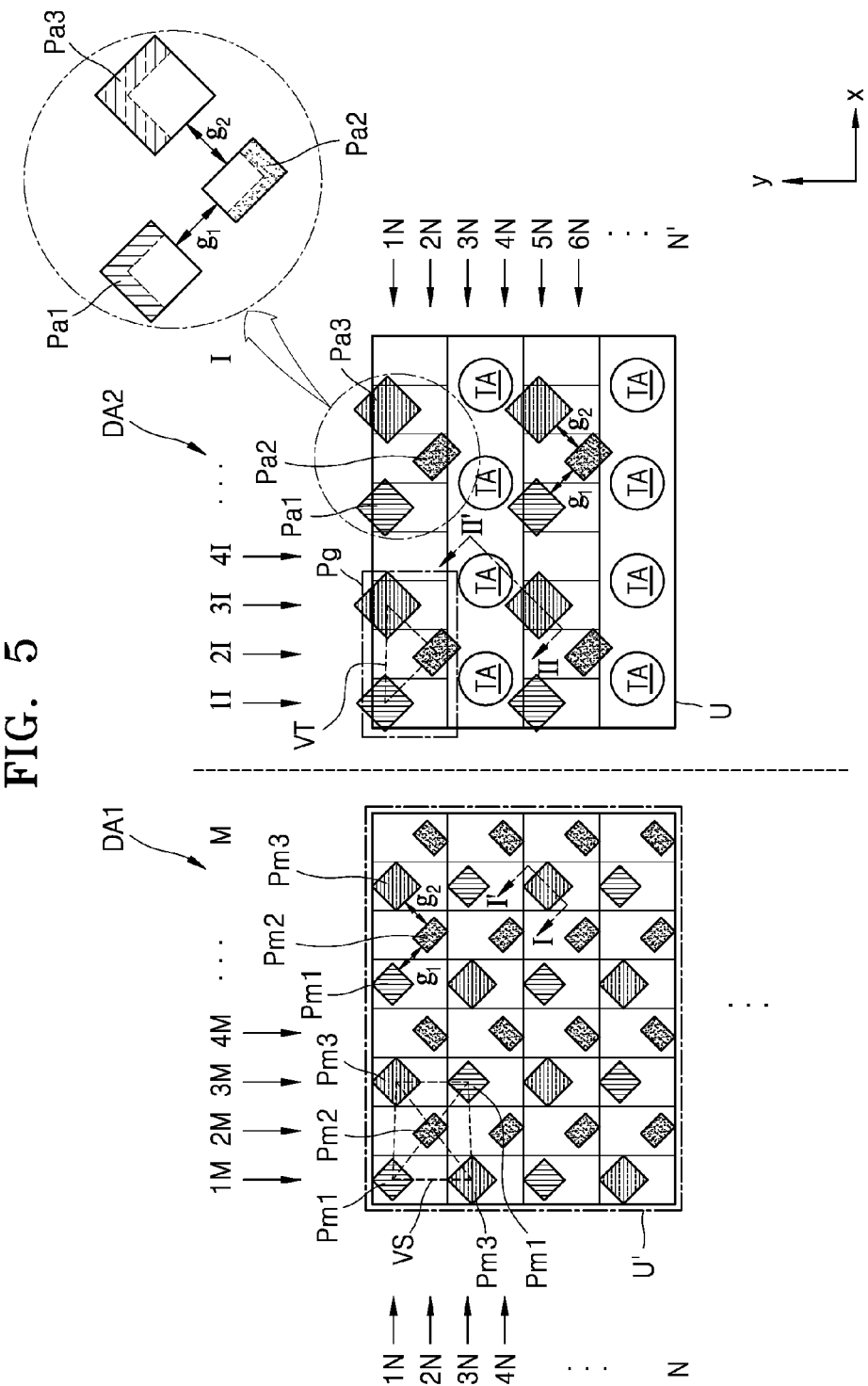
FIG. 5 is a schematic layout diagram illustrating the arrangement of sub-pixels and transmission portions, which are arranged in a first display area and a second display area according to some example embodiments.
Figure 6:
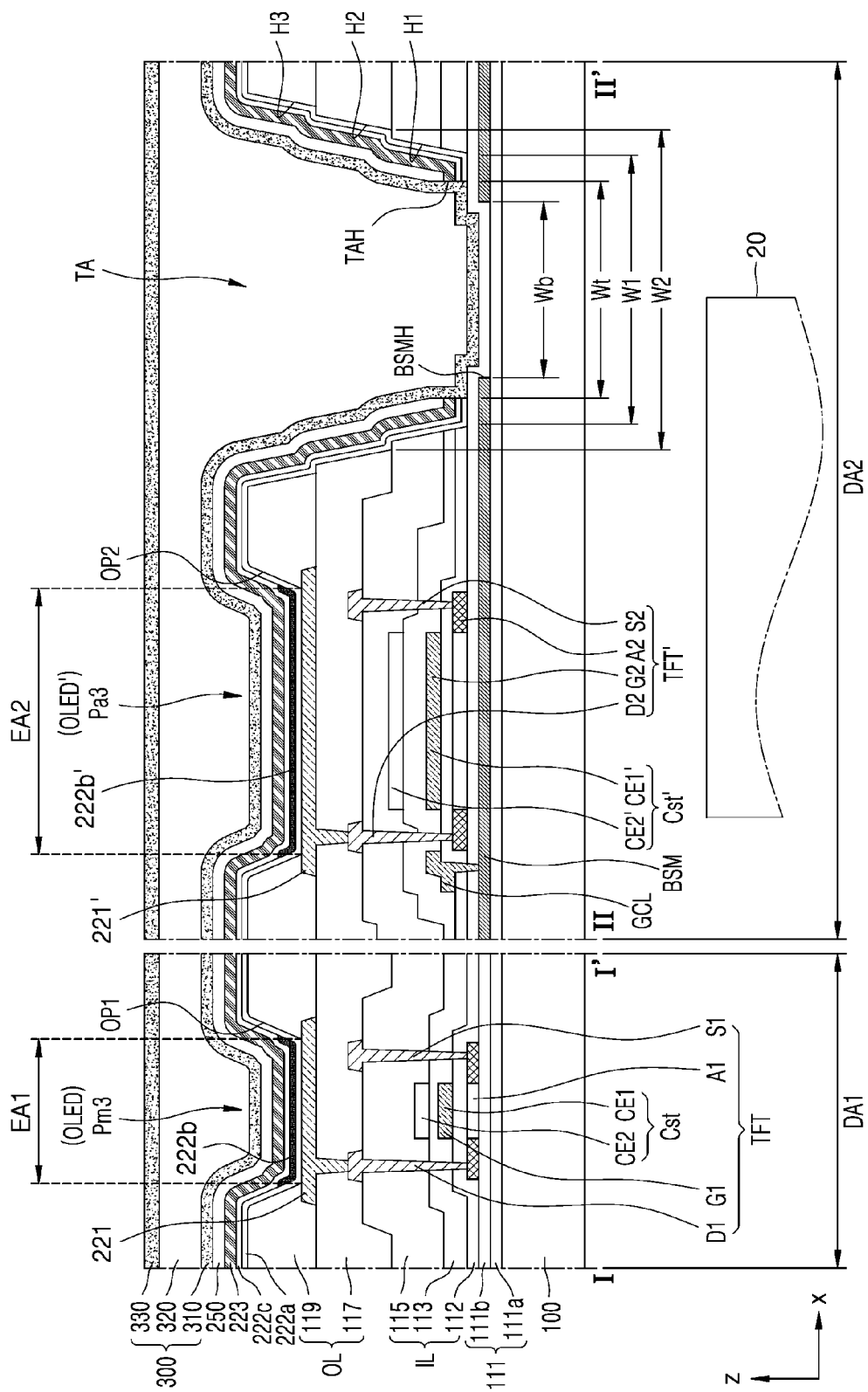
FIG. 6 is a cross-sectional view taken along the lines I-I' and II-II' of FIG. 5.

FIG. 5 is a schematic layout diagram illustrating the arrangement of sub-pixels and transmission portions, which are arranged in a first display area and a second display area, and FIG. 6 is cross-sectional views taken along the lines I-I' and II-II' of FIG. 5.

Referring to FIG. 5, in the display apparatus according to some example embodiments, first to third main sub-pixels Pm1, Pm2, and Pm3 may be arranged in a first display area DA1, and first to third auxiliary sub-pixels Pa1, Pa2, and Pa3 and transmission portions TA may be arranged in a second display area DA2.

According to some example embodiments, the first to third auxiliary sub-pixels Pa1, Pa2, and Pa3 arranged in the second display area DA2 may be arranged in a pixel arrangement structure arranged in two rows between the transmission portions TA. As described above, the sub-pixel as used herein refers to an emission area as a minimum unit for implementing an image. When an organic light-emitting diode is employed as a display element, the emission area may be defined by an opening of a pixel defining layer, which will be described in more detail below.

As illustrated in FIG. 5, the main sub-pixels Pm1, Pm2, and Pm3 arranged in the first display area DA1 may be arranged in a pentile structure. The first main sub-pixel Pm1, the second main sub-pixel Pm2, and the third main sub-pixel Pm3 may implement different colors. For example, the first main sub-pixel Pm1, the second main sub-pixel Pm2, and the third main sub-pixel Pm3 may implement red, green, and blue colors, respectively.

A plurality of first main sub-pixels Pm1 and a plurality of third main sub-pixels Pm3 may be alternately arranged in a first row 1N. A plurality of second main sub-pixels Pm2 may be apart from each other at certain intervals in an adjacent second row 2N. The third main sub-pixels Pm3 and the first main sub-pixels Pm1 may be alternately arranged in an adjacent third row 3N. The second main sub-pixels Pm2 may be apart from each other at certain intervals In an adjacent fourth row 4N. Such a pixel arrangement may be repeated up to an $N^{th}$ row. The sizes of the third main sub-pixel Pm3 and the first main sub-pixel Pm1 may be greater than the size of the second main sub-pixel Pm2.

In this case, the first main sub-pixels Pm1 and the third main sub-pixel Pm3 arranged in the first row 1N and the second main sub-pixels Pm2 arranged in the second row 2N may be alternately arranged. Therefore, the first main sub-pixels Pm1 and the third main sub-pixels Pm3 may be alternately arranged in a first column 1M. The second main sub-pixels Pm2 may be apart from each other at certain intervals in a second column 2M. The third main sub-pixels Pm3 and the first main sub-pixels Pm1 may be alternately arranged in a third column 3M. The second main sub-pixels Pm2 may be apart from each other at certain intervals In a fourth column 4M. Such a pixel arrangement may be repeated up to an $M^{th}$ column.

The pixel arrangement structure may be expressed differently as follows: the first main sub-pixels Pm1 are arranged at first and third vertices facing each other among the vertices of a virtual rectangle VS having a center point of the second main sub-pixel Pm2 as a center point of a rectangle, and the third main sub-pixels Pm3 are arranged at second and fourth vertices that are the other vertices. In this case, the virtual rectangle VS may be modified in various forms, such as a rectangle, a rhombus, and a square.

Such a pixel arrangement structure is referred to as a pentile matrix structure or a pentile structure, and high resolution may be implemented with a small number of pixels by applying a rendering driving that expresses colors by sharing adjacent pixels.

The auxiliary sub-pixels Pa1, Pa2, and Pa3 arranged in the second display area DA2 may be based on the pentile structure and arranged in a pixel arrangement structure arranged in two rows between the transmission portions TA in a y direction.

The first auxiliary sub-pixel Pa1, the second auxiliary sub-pixel Pa2, and the third auxiliary sub-pixel Pa3 may implement different colors. For example, the first auxiliary sub-pixel Pa1, the second auxiliary sub-pixel Pa2, and the third auxiliary sub-pixel Pa3 may implement red, green, and blue colors, respectively.

The first auxiliary sub-pixels Pa1 and the third auxiliary sub-pixels Pa3 may be alternately arranged in the first row 1N, and the second auxiliary sub-pixels Pa2 may be apart from each other at certain intervals in the adjacent second row 2N. Next, transmission portions TA may be arrange corresponding to the adjacent third and fourth rows 3N and 4N. Such a pixel arrangement may be repeated up to an N'th row.

In this case, the first auxiliary sub-pixels Pa1 and the third auxiliary sub-pixel Pa3 arranged in the first row 1N and the second auxiliary sub-pixels Pa2 arranged in the second row 2N may be alternately arranged. Therefore, the first auxiliary sub-pixels Pa1 and the third auxiliary sub-pixels Pa3 may be alternately arranged in a first column 11. The second auxiliary sub-pixels Pa2 may be apart from each other at certain intervals in a second column 21. The third auxiliary sub-pixels Pa3 and the first auxiliary sub-pixels Pa1 may be alternately arranged in a third column 31. Next, no auxiliary sub-pixels may be arranged in an adjacent fourth column 41. Such a pixel arrangement may be repeated up to an $I^{th}$ column.

Compared with the basic pentile structure arranged in the first display area DA1, the pixel arrangement structure has no sub-pixels arranged in the third row 3N and the fourth row 4N and no sub-pixels arranged in the fourth column 41. Therefore, in the basic pentile structure, only three sub-pixels may be arranged in the second display area DA2 that allows eight sub-pixels to be arranged. Such a pixel arrangement structure is referred to as a ⅜ pentile structure.

Such a pixel arrangement structure is differently expressed as follows: the first auxiliary sub-pixel Pa1, the second auxiliary sub-pixel Pa2, and the third auxiliary sub-pixel Pa3 are arranged at the vertices of a virtual triangle VT. The first auxiliary sub-pixel Pa1, the second auxiliary sub-pixel Pa2, and the third auxiliary sub-pixel Pa3 may form a single pixel group Pg. That is, the sub-pixels included in the single pixel group Pg may be arranged in two rows in the y direction and three columns along the x direction.

The transmission portion TA is an area in which no display element is arranged and thus light transmittance is high. A plurality of transmission portions may be provided in the second display area DA2. The transmission portions TA may be alternately arranged with the pixel groups Pg in the y direction. The transmission portion TA may be provided in various shapes such as a polygon, an octagon, an ellipse, and a circle. When the transmission portion TA is provided close to a circle, the diffraction characteristics of light may be improved. Therefore, when the component arranged below the second display area DA2 is an image sensor or a camera, the transmission portion TA may be provided close to a circle. The shape of the transmission portion TA may be determined as the shape of the hole BSMH provided in the lower electrode layer BSM (see FIG. 2).

In the second display area DA2, the arrangement of a base unit U, in which a certain number of pixel groups Pg and a certain number of transmission portions TA are bundled, may be repeatedly arranged in the x direction and the y direction.

In FIG. 5, the base unit U may have a shape in which four pixel groups Pg and eight transmission portions TA arranged therearound are bundled in a rectangular shape. The basic unit U is a division of a repetitive shape and does not mean disconnection of a structure. According to some example embodiments, the pixel groups Pg may be continuously arranged in the x direction. However, embodiments are not limited thereto. The pixel groups Pg and the transmission portions TA may be variously arranged in the base unit U.

A corresponding unit U ' provided with the same area as that of the base unit U may be set in the first display area DA1. In this case, the number of main sub-pixels Pm1, Pm2, and Pm3 included in the corresponding unit U' may be greater than the number of auxiliary sub-pixels Pa1, Pa2, and Pa3 included in the base unit U. That is, the number of auxiliary sub-pixels Pa1, Pa2, and Pa3 included in the base unit U is 12, and the number of main sub-pixels Pm1, Pm2, and Pm3 included in the corresponding unit U' is 32. Therefore, the number of auxiliary sub-pixels Pa1, Pa2, and Pa3 and the number of main sub-pixels Pm1, Pm2, and Pm3 per base unit may be provided at a ratio of 3:8.

According to some example embodiments, as illustrated in FIG. 5, the auxiliary sub-pixels Pa1, Pa2, and Pa3 have a pixel arrangement structure provided in two rows between the transmission portions TA arranged in the y direction. The size of each of the auxiliary sub-pixels Pa1, Pa2, and Pa3 may be designed to be greater than the size of each of the main sub-pixels Pm1, Pm2, and Pm3 exhibiting the same color.

The first auxiliary sub-pixel Pa1, the second auxiliary sub-pixel Pa2, and the third auxiliary sub-pixel Pa3 exhibit different colors. Therefore, in order to form the first auxiliary sub-pixel Pa1, the second auxiliary sub-pixel Pa2, and the third auxiliary sub-pixel Pa3, emission layers may be deposited using a fine metal mask. In this case, in order to secure the reliability of the process, the first auxiliary sub-pixel Pa1, the second auxiliary sub-pixel Pa2, and the third auxiliary sub-pixel Pa3 may be arranged with certain gaps g1 and g2 therebetween.

According to some example embodiments, the transmission portions TA may be arranged above and below the pixel group Pg including the first auxiliary sub-pixel Pa1, the second auxiliary sub-pixel Pa2, and the third auxiliary sub-pixel Pa3. Only the size of each emission area may expand in the +y direction or the −y direction without changing the gaps between the auxiliary sub-pixels Pa1, Pa2, and Pa3.

For example, as illustrated in the enlarged view of FIG. 5, the first auxiliary sub-pixel Pa1 and the third auxiliary sub-pixel Pa3 may expand in the +y direction and the second auxiliary sub-pixel Pa2 may expand in the −y direction. In the enlarged view of FIG. 5, a dashed line indicated in each of the auxiliary sub-pixels Pa1, Pa2, and Pa3 represents the size of each of the main sub-pixels Pm1, Pm2, and Pm3.

When the auxiliary sub-pixels Pa1, Pa2, Pa3 included in the pixel group Pg are arranged in three or more rows, the gaps g1 and g2 between the auxiliary sub-pixels Pa1, Pa2, and Pa3 have to be maintained so as to expand the sizes of the auxiliary sub-pixels Pa1, Pa2, and Pa3. The gaps between the rows may be farther apart, and thus, the overall pixel arrangement may be misaligned and a sufficient area of the transmission portion TA may not be secured.

According to some example embodiments, the auxiliary sub-pixels Pa1, Pa2, and Pa3 included in the pixel group Pg are provided in two rows. Even when the sizes of the auxiliary sub-pixels Pa1, Pa2, and Pa3 partially expand, the auxiliary sub-pixels Pa1, Pa2, and Pa3 may be arranged in the same row as that of the main sub-pixels arranged in the first display area DA1. Even when the sizes of the auxiliary sub-pixels Pa1, Pa2, and Pa3 are increased, the reduction in the area of the transmission portion TA may be minimized or reduced.

According to some example embodiments, the size of at least one of the auxiliary sub-pixels Pa1, Pa2, and Pa3 may be greater than the sizes of the main sub-pixels Pm1, Pm2, and Pm3 that implement the same color.

In a case in which the auxiliary sub-pixels Pa1, Pa2, and Pa3 have the same sizes as those of the main sub-pixels Pm1, Pm2, and Pm3, when the same current is applied to the auxiliary sub-pixels Pa1, Pa2, and Pa3 and the main sub-pixels Pm1, Pm2, and Pm3, the luminance of the second display area DA2 may be reduced as a whole. When more current is applied to the auxiliary sub-pixels Pa1, Pa2, and Pa3 so as to compensate for the luminance of the second display area DA2, the auxiliary sub-pixels Pa1, Pa2, and Pa3 may be easily degraded.

According to some example embodiments, it may be possible to prevent or reduce the degradation of the auxiliary sub-pixels Pa1, Pa2, and Pa3 and improve the luminance by employing a pixel arrangement structure in which the emission area of the auxiliary sub-pixels Pa1, Pa2, and Pa3 is provided with a large size in the second display area DA2.

Furthermore, according to some example embodiments, the three auxiliary sub-pixels Pa1, Pa2, and Pa3 included in the single pixel group Pg may be distributed among the transmission portions TA, thereby improving visibility, which will be described in more detail below.

FIG. 6 is a cross-sectional view taken along the lines I-I' and II-II' of FIG. 5. Referring to FIG. 6, a display apparatus according to some example embodiments may include a first display area DA1 and a second display area DA2. A third main sub-pixel Pm3 may be arranged in the first display area DA1, and a third auxiliary sub-pixel Pa3 and a transmission portion TA may be arranged in the second display area DA2. In this case, the third main sub-pixel Pm3 and the third auxiliary sub-pixel Pa3 may be sub-pixels that exhibit the same color. According to some example embodiments, the third main sub-pixel Pm3 and the third auxiliary sub-pixel Pa3 may implement a blue color.

The main sub-pixel Pm may include a first thin-film transistor TFT, a main storage capacitor Cst, and a main organic light-emitting diode OLED. The auxiliary sub-pixel Pa may include a second thin-film transistor TFT', an auxiliary storage capacitor Cst', and an auxiliary organic light-emitting diode OLED'. The transmission portion TA may include an opening area TAH so as to correspond to the transmission portion TA.

A component 20 may be arranged below the second display area DA2. The component 20 may be a camera configured to capture an image, an image sensor, or an infrared (IR) sensor configured to transmit and receive infrared light. Since the transmission portion TA is arranged in the second display area DA2, the second display area DA2 may transmit light transmitted to and received from the component 20. For example, light emitted from the component 20 may travel through the transmission portion TA in a z direction, and light generated from the outside of the display apparatus and incident onto the component 20 may travel through the transmission portion TA in a −z direction. In some embodiments, the component 20 may include a plurality of image sensors such that one image sensor is arranged to correspond to one transmission portion TA.

Hereinafter, a structure in which the elements included in the display apparatus, according to embodiments, are stacked will be described.

A substrate 100 may include glass or a polymer resin. The polymer resin may include polyethersulfone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP). The substrate 100 including the polymer resin may have flexible, rollable, or bendable characteristics. The substrate 100 may have a multi-layered structure including an inorganic layer and a layer including the above-described polymer resin.

A buffer layer 111 may be arranged on the substrate 100. The buffer layer 111 may reduce or block penetration of foreign matter, moisture, or external air from the bottom of the substrate 100 and may provide a flat surface on the substrate 100. The buffer layer 111 may include an inorganic material such as oxide or nitride, an organic material, or an organic/inorganic composite and may have a single-layered structure or a multi-layered structure of an inorganic material and an organic material. A barrier layer configured to block penetration of external air may be further included between the substrate 100 and the buffer layer 111. According to some example embodiments, the buffer layer 111 may include silicon oxide ($SiO_2$) or silicon nitride ($SiN_x$). The buffer layer 111 may have a structure in which a first buffer layer 111a and a second buffer layer 111b are stacked.

A lower electrode layer BSM may be arranged between the first buffer layer 111a and the second buffer layer 111b in the second display area DA2. According to some example embodiments, the lower electrode layer BSM may also be arranged between the substrate 100 and the first buffer layer 111a. The lower electrode layer BSM may be arranged below a second thin-film transistor TFT' to prevent the characteristics of the second thin-film transistor TFT' from being degraded by the light emitted from the component 20 or the like.

In addition, the lower electrode layer BSM may be connected to a line GCL arranged on another layer through a contact hole. The lower electrode layer BSM may receive a constant voltage or signal from the line GCL. For example, the lower electrode layer BSM may receive a driving voltage ELVDD or a scan signal. Because the lower electrode layer BSM receives the constant voltage or signal, the probability of generating electrostatic discharge may be significantly reduced. The lower electrode layer BSM may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). The lower electrode layer BSM may be a single layer or a multi-layer including the above-described material.

According to some example embodiments, the lower electrode layer BSM may be provided to correspond to the entire second display area DA. In this case, the lower electrode layer BSM may include a lower hole BSMH corresponding to the transmission portion TA. According to some example embodiments, the shape and size of the transmission portion TA may be defined by the shape and size of the lower hole BSMH. That is, a width Wb of the lower hole BSMH may coincide with a width of the transmission portion TA. According to some example embodiments, the lower hole BSMH may be provided in a circular shape by taking into account the diffraction characteristics of light.

The first thin-film transistor TFT and the second thin-film transistor TFT' may be arranged on the buffer layer 111. The first thin-film transistor TFT1 may include a first semiconductor layer A1, a first gate electrode G1, a first source electrode S1, and a first drain electrode D1, and the second thin-film transistor TFT' may include a second semiconductor layer A2, a second gate electrode G2, a second source electrode S2, and a second drain electrode D2. The first thin-film transistor TFT may be electrically connected to the main organic-light emitting diode OLED of the first display area DA1 to drive the main organic light-emitting diode OLED. The second thin-film transistor TFT' may be electrically connected to the auxiliary organic-light emitting diode OLED' of the second display area DA2 to drive the auxiliary organic light-emitting diode OLED'.

The first semiconductor layer A1 and the second semiconductor layer A2 may be arranged on the buffer layer 111 and may include polysilicon. According to some example embodiments, the first semiconductor layer A1 and the second semiconductor layer A2 may include amorphous silicon. According to some example embodiments, the first semiconductor layer A1 and the second semiconductor layer A2 may each include an oxide of at least one selected from indium (In), gallium (Ga), stannum (Sn), zirconium (Zr), vanadium (V), hafnium (Hf), cadmium (Cd), germanium (Ge), chromium (Cr), titanium (Ti), or zinc (Zn). The first semiconductor layer A1 and the second semiconductor layer A2 may each include a channel region, and a source region and a drain region doped with impurities.

The first semiconductor layer A1 may overlap the lower electrode layer BSM with the second buffer layer 111b therebetween. According to some example embodiments, the width of the first semiconductor layer A1 may be less than the width of the lower electrode layer BSM. Therefore, when projected in a direction perpendicular to the substrate 100, the first semiconductor layer A1 may overlap the lower electrode layer BSM as a whole.

A first gate insulating layer 112 may be provided to cover the first semiconductor layer A1 and the second semiconductor layer A2. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may be a single layer or a multi-layer including the above-described inorganic insulating material.

A first gate electrode G1 and a second gate electrode G2 may be arranged on the first gate insulating layer 112 so as to overlap the first semiconductor layer A1 and the second semiconductor layer A2, respectively. The first gate electrode G1 and the second gate electrode G2 may each include molybdenum (Mo), aluminum (Al), copper (Cu), titanium (Ti), or the like and may be a single layer or a multi-layer. For example, the first gate electrode G1 and the second gate electrode G2 may each be a single layer of Mo.

A second gate insulating layer 113 may be provided to cover the first gate electrode G1 and the second gate electrode G2. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 113 may be a single layer or a multi-layer including the above-described inorganic insulating material.

A first upper electrode CE2 of the main storage capacitor Cst and a second upper electrode CE2' of the auxiliary storage capacitor Cst' may be arranged on the second gate insulating layer 113.

In the first display area DA1, the first upper electrode CE2 may overlap the first gate electrode G1 therebelow. The first gate electrode G1 and the first upper electrode CE2, which overlap each other with the second gate insulating layer 113 therebetween, may constitute the main storage capacitor Cst. The first gate electrode G1 may be the first lower electrode CE1 of the main storage capacitor Cst.

In the second display area DA2, the second upper electrode CE2' may overlap the second gate electrode G2 therebelow. The second gate electrode G2 and the second upper electrode CE2', which overlap each other with the second gate insulating layer 113 therebetween, may constitute the auxiliary storage capacitor Cst'. The first gate electrode G1 may be the second lower electrode CE1' of the auxiliary storage capacitor Cst'.

The first upper electrode CE2 and the second upper electrode CE2' may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu) and may be a single layer or a multi-layer including the above-described material.

An interlayer insulating layer 115 may cover the first upper electrode CE2 and the second upper electrode CE2'. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

When the first gate insulating layer 112, the second gate insulating layer 113, and the interlayer insulating layer 115 are collectively referred to as an inorganic insulating layer IL, a structure in which the inorganic insulating layer IL is stacked on the substrate 100 may have a transmittance of about 90% or more with respect to an infrared wavelength. For example, light having a wavelength of about 900 nm to about 1,100 nm passing through the substrate 100 and the inorganic insulating layer IL may have a transmittance of about 90%.

Source electrodes S1 and S2 and drain electrodes D1 and D2 may be arranged on the interlayer insulating layer 115. The source electrodes S1 and S2 and the drain electrodes D1 and D2 may each include a conductive material including molybdenum (Mo), aluminum (Al), copper (Cu), titanium (Ti), and the like and may each be a single layer or a multi-layer including the above-described material. For example, the source electrodes S1 and S2 and the drain electrodes D1 and D2 may each have a multi-layered structure of Ti/Al/Ti.

A planarization layer 117 may be arranged to cover the source electrodes S1 and S2 and the drain electrodes D1 and D2. The planarization layer 117 may have a flat upper surface such that a first pixel electrode 221 and a second pixel electrode 221' to be arranged thereon is formed flat.

The planarization layer 117 may be a single layer or a multi-layer of a film including an organic material. The planarization layer 117 may include a general-purpose polymer (for example, benzocyclobutene (BCB), polyimide, hexamethyldisiloxane (HMDSO), polymethylmethacrylate (PMMA), or polystyrene (PS)), a polymer derivative having a phenol-based group, an acryl-based polymer, an imide-based polymer, an arylether-based polymer, an amide-based polymer, a fluorine-based polymer, a p-xylene-based polymer, a vinylalcohol-based polymer, and any blend thereof.

The planarization layer 117 may include an opening that exposes one of the first source electrode S1 and the first drain electrode D1 of the first thin-film transistor TFT, and the first pixel electrode 221 may be electrically connected to the first thin-film transistor TFT by contacting the first source electrode S1 or the first drain electrode D1 through the opening.

In addition, the planarization layer 117 may include an opening that exposes one of the second source electrode S2 and the second drain electrode D2 of the second thin-film transistor TFT', and the second pixel electrode 221' may be electrically connected to the second thin-film transistor TFT' by contacting the second source electrode S2 or the second drain electrode D2 through the opening.

The first pixel electrode 221 and the second pixel electrode 221' may each include a conductive oxide, such as indium tin oxide (ITO), indium zinc oxide (IZO), zinc oxide (ZnO), indium oxide (In$_2$O$_3$), indium gallium oxide (IGO), or aluminum zinc oxide (AZO). According to some example embodiments, the first pixel electrode 221 and the second pixel electrode 221' may each include a reflective film including silver (Ag), magnesium (Mg), aluminum (Al), platinum (Pt), palladium (Pd), gold (Au), nickel (Ni), neodymium (Nd), iridium (Ir), chromium (Cr), or any compound thereof. According to some example embodiments, the first pixel electrode 221 and the second pixel electrode 221' may each further include a film including ITO, IZO, ZnO, or In$_2$O$_3$ above and/or below the reflective film. In some embodiments, the first pixel electrode 221 and the second pixel electrode 221' may each have a stacked structure of ITO/Ag/ITO.

The pixel defining layer 119 may cover edges of the first pixel electrode 221 and the second pixel electrode 221'. The pixel defining layer 119 may overlap the first pixel electrode 221 and the second pixel electrode 221' and may include a first opening OP1 and a second opening OP2 defining an emission area of the sub-pixel. The pixel defining layer 119 increases a distance between the edges of the first and second pixel electrodes 221 and 221' and the opposite electrode 223 above the first and second pixel electrodes 221 and 221', thereby preventing arc or the like from occurring at the edges of the first and second pixel electrode 221 and 221'. The pixel defining layer 119 may include at least one organic insulating material such as polyimide, polyamide, an acrylic resin, benzocyclobutene, hexamethyldisiloxane (HMDSO), and a phenol resin and may be formed by spin coating or the like.

When the planarization layer 117 and the pixel defining layer 119 are referred to as an organic insulating layer OL, the organic insulating layer OL may have a transmittance of about 90% or more with respect to an infrared wavelength. For example, light having a wavelength of about 900 nm to about 1,100 nm passing through the organic insulating layer OL may have a transmittance of about 90%.

In the first opening OP1 and the second opening OP2 of the pixel defining layer 119, a first emission layer 221b and a second emission layer 222b' may be provided to correspond to the first pixel electrode 221 and the second pixel electrode 221', respectively. The first emission layer 222b and the second emission layer 222b' may each include a high-molecular-weight material or a low-molecular-weight material and may emit red light, green light, blue light, or white light.

An organic functional layer 222e may be arranged above and/or below the first emission layer 222b and the second emission layer 222b'. The organic functional layer 222e may include a first functional layer 222a and/or a second functional layer 222c. The first functional layer 222a or the second functional layer 222c may be omitted.

The first functional layer 222a may be arranged below the first emission layer 222b and the second emission layer 222b'. The first functional layer 222a may be a single layer or a multi-layer including an organic material. The first functional layer 222a may be a hole transport layer (HTL) having a single-layered structure. Alternatively, the first functional layer 222a may include a hole injection layer (HIL) and an HTL. The first functional layer 222a may be integrally formed so as to correspond to the main sub-pixels Pm and the auxiliary sub-pixels Pa included in the first display area DA1 and the second display area DA2. Therefore, the first functional layer 222a may be arranged to correspond to the transmission portion TA.

The second functional layer 222c may be arranged on the first emission layer 222b and the second emission layer 222b'. The second functional layer 222c may be a single layer or a multi-layer including an organic material. The second functional layer 222 may include an electron transport layer (ETL) and/or an electron injection layer (EIL). The second functional layer 222c may be integrally formed so as to correspond to the main sub-pixels Pm and the auxiliary sub-pixels Pa included in the first display area DA1 and the second display area DA2. Therefore, the second functional layer 222c may be arranged to correspond to the transmission portion TA.

An opposite electrode 223 may be arranged on the second functional layer 222c. The opposite electrode 223 may include a conductive material having a low work function. For example, the opposite electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 223 may further include a layer such as ITO, IZO, ZnO, or In$_2$O$_3$ on the (semi) transparent layer including the above-mentioned material. The opposite electrode 223 may be integrally formed so as to correspond to the main sub-pixels Pm and the auxiliary sub-pixels Pa included in the first display area DA1 and the second display area DA2.

The layers from the first pixel electrode 221 to the opposite electrode 223, which are formed in the first display area DA1, may constitute a main organic light-emitting diode OLED. The layers from the second pixel electrode 221' to the opposite electrode 223, which are formed in the second display area DA2, may constitute an auxiliary organic light-emitting diode OLED'.

An upper layer 250 including an organic material may be arranged on the opposite electrode 223. The upper layer 250 may be a layer provided so as to protect the opposite electrode 223 and increase light extraction efficiency. The upper layer 250 may include an organic material having a refractive index higher than that of the opposite electrode 223. Alternatively, the upper layer 250 may be provided by stacking layers having different refractive indices. For example, the upper layer 250 may be provided by stacking a high-refractive-index layer and a low-refractive-index layer and a high-refractive-index layer. In this case, the refractive index of the high-refractive-index layer may be about 1.7 or more, and the refractive index of the low-refractive-index layer may be about 1.3 or less.

The upper layer 250 may additionally include LiF. Alternatively, the upper layer 250 may additionally include an inorganic insulating material such as silicon oxide ($SiO_2$) or silicon nitride ($SiN_x$).

According to some example embodiments, the first functional layer 222a, the second functional layer 222c, the opposite electrode 223, and the upper layer 250 may each include an opening area TAH corresponding to the transmission portion TA. That is, the first functional layer 222a, the second functional layer 222c, the opposite electrode 223, and the upper layer 250 may each include an opening corresponding to the transmission portion TA.

The openings of the first functional layer 222a, the second functional layer 222c, the opposite electrode 223, and the upper layer 250 may be formed by a direct laser irradiation method or a laser lift-off method using a sacrificial layer. Therefore, the widths of the openings forming the opening area TAH may be substantially equal to each other. For example, the width Wt of the opening of the opposite electrode 223 may be substantially equal to the width Wt of the opening area TAH.

When the size of the transmission portion TA is determined by the lower hole BSMH of the lower electrode layer BSM, the width Wb of the lower hole BSMH may be less than or equal to the width Wt of the opening area TAH.

That the opening area TAH corresponds to the transmission portion TA may mean that the opening area TAH overlaps the transmission portion TA. In this case, an area of the opening area TAH may be less than an area of a first hole H1 formed in the inorganic insulating layer IL. To this end, the width Wt of the opening area TAH is illustrated in FIG. 6 as being less than the width W1 of the first hole H1. The area of the opening area TAH and the area of the first hole H1 may be defined as the area of the opening having the smallest area.

According to some example embodiments, the first functional layer 222a, the second functional layer 222c, the opposite electrode 223, and the upper layer 250 may be arranged on side surfaces of the first hole H1, a second hole H2, and a third hole H3. In some embodiments, the slopes of the side surfaces of the first hole H1, the second hole H2, and the third hole H3 with respect to the upper surfaces of the substrate 100 may be gentler than the slope of the side surface of the opening area TAH with respect to the upper surface of the substrate 100.

Because the forming of the opening area TAH means that the member such as the opposite electrode 223 is removed from the transmission portion TA, the light transmittance of the transmission portion TA may be significantly increased.

The main organic light-emitting diode OLED and the auxiliary organic light-emitting diode OLED' may be sealed by a thin-film encapsulation layer 300. The thin-film encapsulation layer 300 may be arranged on the upper layer 250. The thin-film encapsulation layer 300 may prevent or reduce instances of external moisture or foreign matter or contaminants penetrating into the main organic light-emitting diode OLED and the auxiliary organic light-emitting diode OLED'.

The thin-film encapsulation layer 300 may include at least one inorganic encapsulation layer and at least one organic encapsulation layer. In this regard, FIG. 6 illustrates the thin-film encapsulation layer 300 having a structure in which a first inorganic encapsulation layer 310, an organic encapsulation layer 320, and a second inorganic encapsulation layer 330 are stacked. According to some example embodiments, the number of organic encapsulation layers, the number of inorganic encapsulation layers, and the stacking order may be changed.

The first inorganic encapsulation layer 310 and the second inorganic encapsulation layer 330 may each include one or more inorganic insulating materials such as aluminum oxide, titanium oxide, tantalum oxide, hafnium oxide, zinc oxide, silicon oxide, silicon nitride, or silicon oxynitride and may be formed by chemical vapor deposition (CVD) or the like. The organic encapsulation layer 320 may include a polymer-based material. The polymer-based material may include a silicon-based resin, an acryl-based resin, an epoxy-based resin, polyimide, polyethylene, and the like.

The first inorganic encapsulation layer 310, the organic encapsulation layer 320, and the second inorganic encapsulation layer 330 may be integrally formed so as to cover the first display area DA1 and the second display area DA2. Therefore, the first inorganic encapsulation layer 310, the organic encapsulation layer 320, and the second inorganic encapsulation layer 330 may be arranged in the opening area TAH.

According to some example embodiments, the organic encapsulation layer 320 may be integrally formed so as to cover the first display area DA1 and the second display area DA2, but may not be present in the transmission portion TA. In other words, the organic encapsulation layer 320 may include an opening corresponding to the transmission portion TA. In this case, the first inorganic encapsulation layer 310 and the second inorganic encapsulation layer 330 may be in contact with each other in the opening area TAH.

According to some example embodiments, the size of the second opening OP2 defining the emission area EA2 of the third auxiliary sub-pixel Pa3 may be greater than the size of the first opening OP1 defining the emission area EA1 of the third main sub-pixel Pm3. Therefore, when the same current is supplied, the luminance of the third auxiliary sub-pixel Pa3 may be implemented to be higher.

Figure 7:
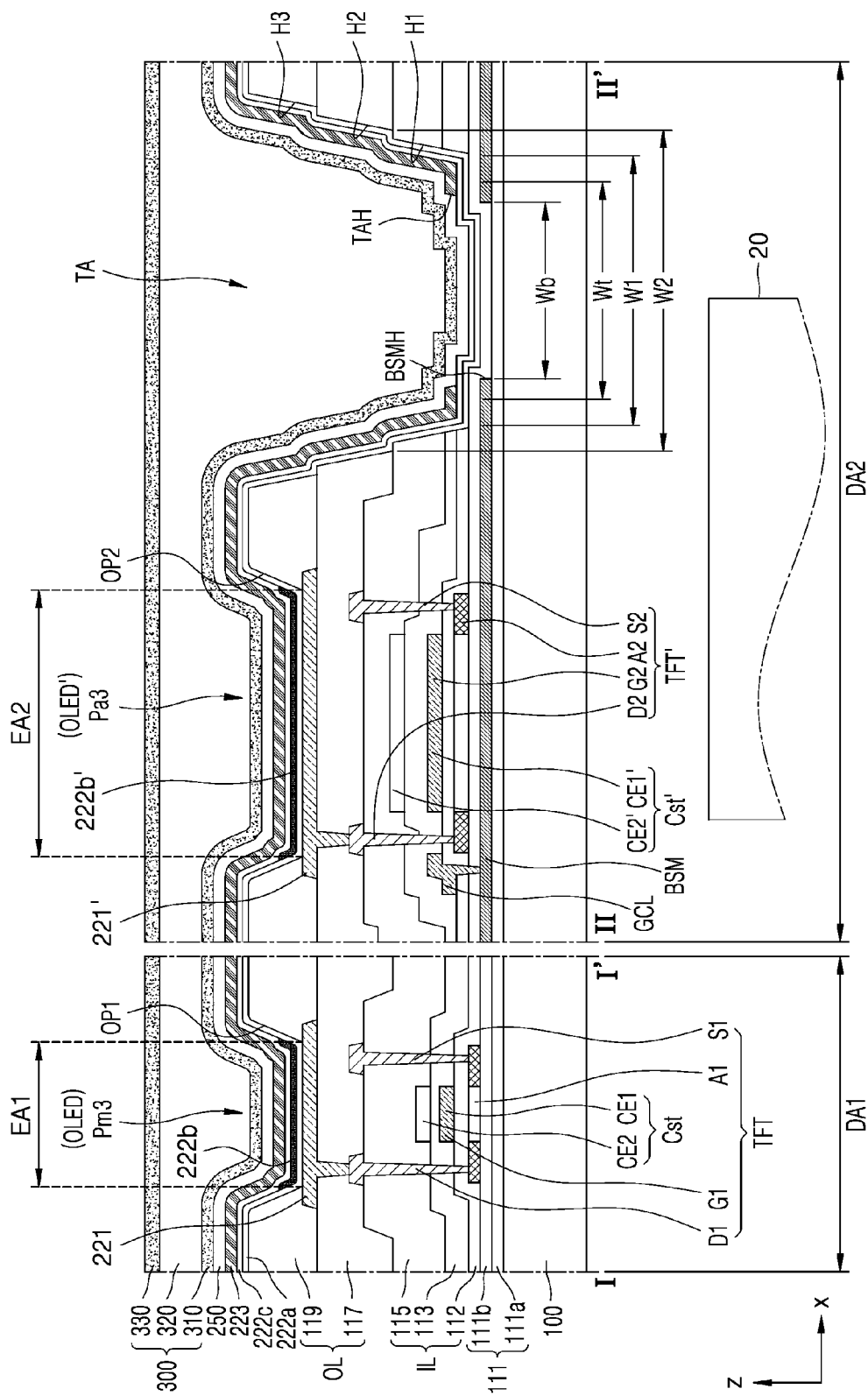
FIG. 7 is a schematic cross-sectional view of a display apparatus according to some example embodiments.

FIG. 7 is a schematic cross-sectional view of a display apparatus according to some example embodiments. In FIG. 7, the same reference numerals as those in FIG. 6 refer to the same members, and a redundant description thereof will be omitted.

Referring to FIG. 7, the display apparatus may include a first display area DA1 in which a main sub-pixel Pm is arranged and a second display area DA2 in which an auxiliary sub-pixel Pa and a transmission portion TA are arranged. An emission area EA2 of the auxiliary sub-pixel Pa may be larger than an emission area EA1 of the main sub-pixel Pm.

According to some example embodiments, at least one of a first functional layer 222*a*, a second functional layer 222*c*, and an upper layer 250 may be arranged to correspond to the transmission portion TA. That is, at least one of the first functional layer 222*a*, the second functional layer 222*c*, and the upper layer 250 may be arranged in an opening area TAH.

An opposite electrode 223 may include an opening corresponding to the transmission portion TA. The width of the opening may be substantially equal to the width of the opening area TAH. In this case, the opposite electrode 223 may be formed using a mask provided with a shielding film that covers the transmission portion TA.

Figure 8:
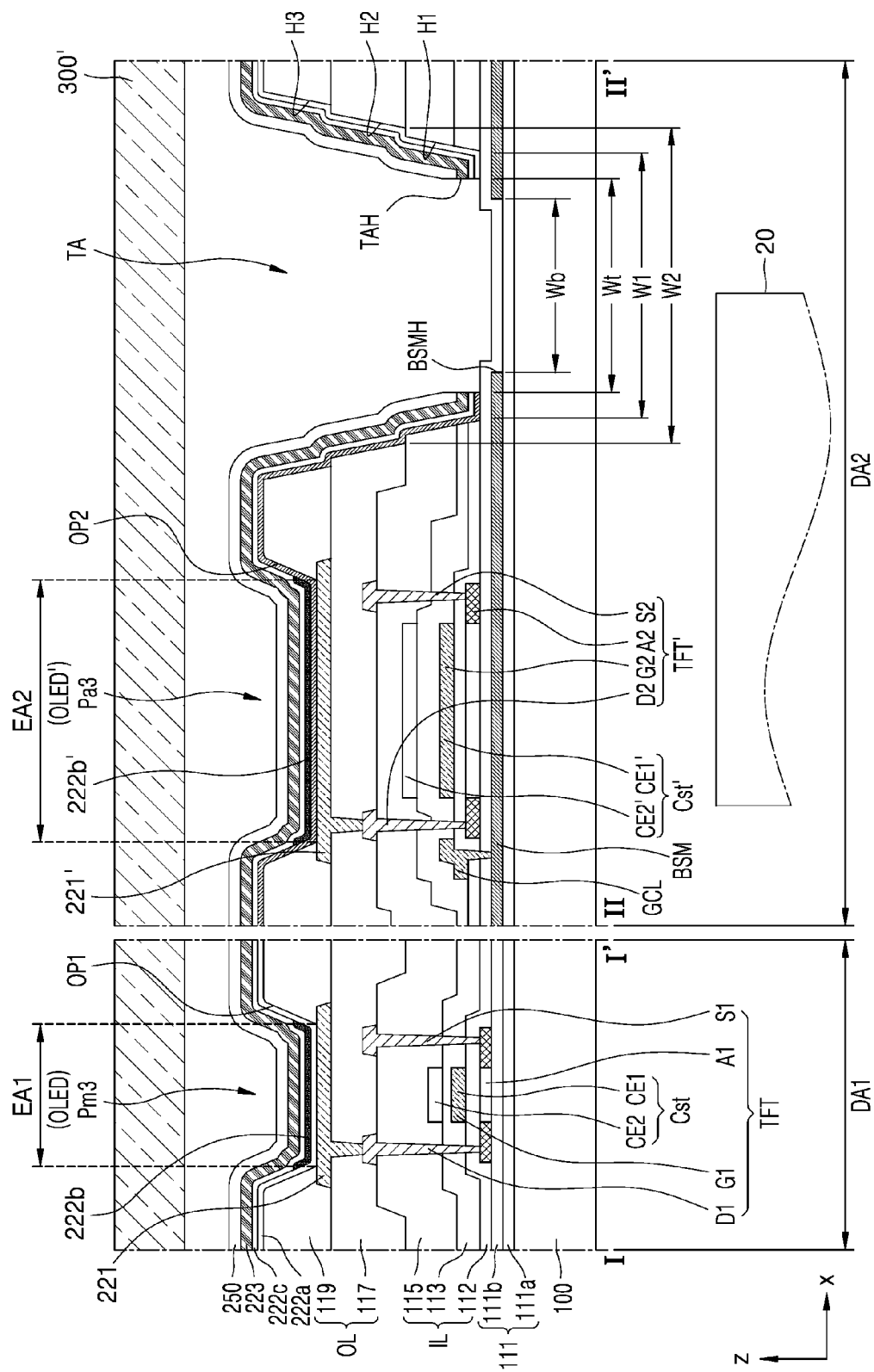
FIG. 8 is a schematic cross-sectional view of a display apparatus according to some example embodiments.

FIG. 8 is a schematic cross-sectional view of a display apparatus according to some example embodiments. In FIG. 8, the same reference numerals as those in FIG. 6 refer to the same members, and a redundant description thereof will be omitted.

Referring to FIG. 8, the display apparatus may include a first display area DA1 in which a main sub-pixel Pm is arranged and a second display area DA2 in which an auxiliary sub-pixel Pa and a transmission portion TA are arranged. An emission area EA2 of the auxiliary sub-pixel Pa may be larger than an emission area EA1 of the main sub-pixel Pm.

According to some example embodiments, a main organic light-emitting diode OLED and an auxiliary organic light-emitting diode OLED' may be covered by an encapsulation substrate 300'. The encapsulation substrate 300' may include a transparent material. For example, the encapsulation substrate 300' may include a glass material. Alternatively, the encapsulation substrate 300' may include a polymer resin or the like. The encapsulation substrate 300' may prevent or reduce instances of external moisture or foreign matter or contaminants penetrating into the main organic light-emitting diode OLED and the auxiliary organic light-emitting diode OLED'.

A sealing material such as a sealant may be arranged between a substrate 100, on which the main organic light-emitting diode OLED and the auxiliary organic light-emitting diode OLED' are formed, and the encapsulation substrate 300'. The sealing material may block external moisture or foreign matter that may penetrate between the substrate 100 and the encapsulation substrate 300'.

Figure 9:
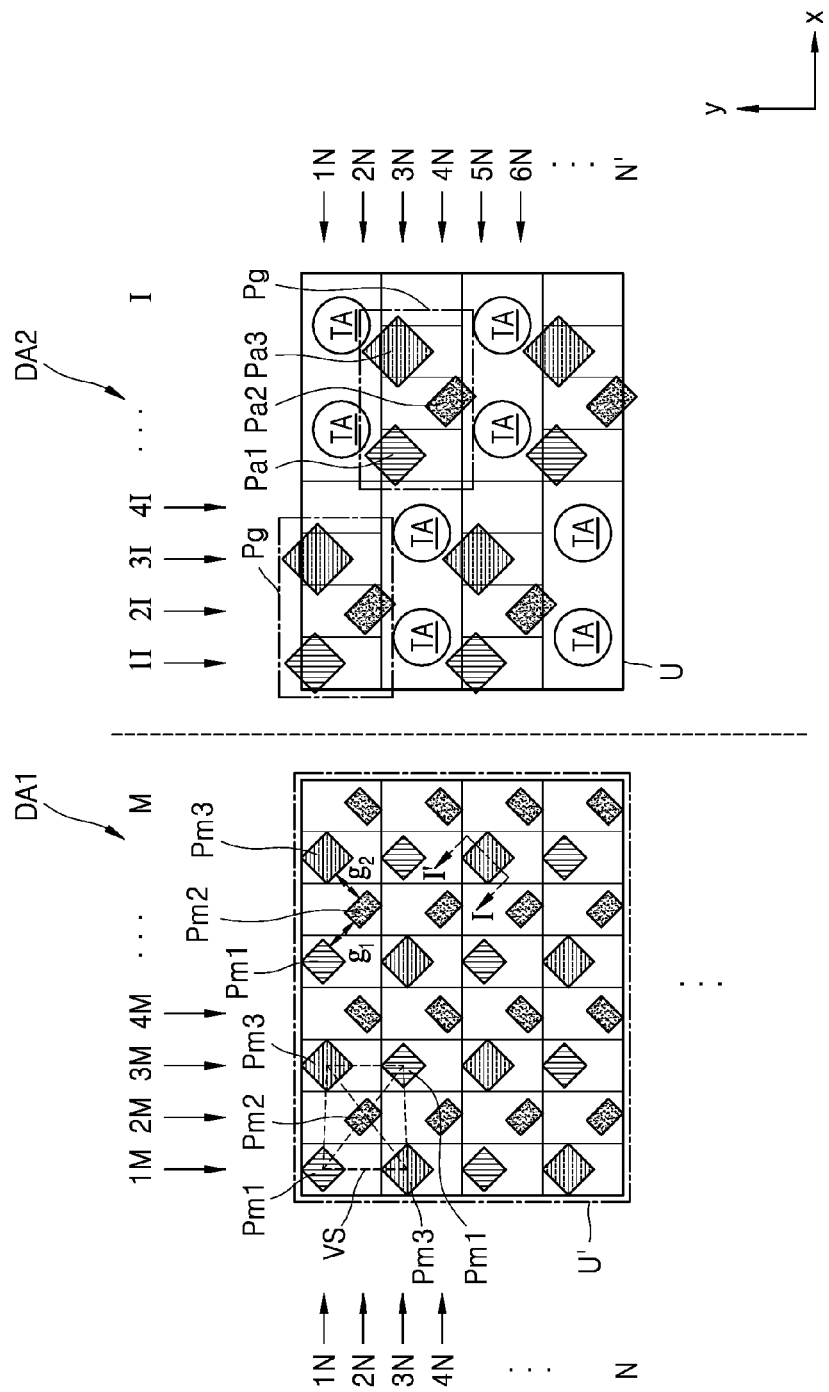
FIG. 9 is a schematic layout diagram illustrating the arrangement of sub-pixels and transmission portions, according to some example embodiments.

FIG. 9 is a schematic layout diagram of a pixel arrangement structure according to some example embodiments. In FIG. 9, the same reference numerals as those in FIG. 5 refer to the same members, and a redundant description thereof will be omitted.

Referring to FIG. 9, a pixel group Pg and a transmission portion TA arranged in a second display area DA2 may be alternately arranged in one direction (y direction). Auxiliary sub-pixels Pa1, Pa2, and Pa3 included in one pixel group Pg may have a pixel arrangement structure with two rows. In addition, the size of at least one of the auxiliary sub-pixels Pa1, Pa2, and Pa3 may be greater than the sizes of main sub-pixels Pm1, Pm2, and Pm3 that exhibit the same color.

According to some example embodiments, a plurality of transmission portions TA may be arranged between the pixel groups Pg in one direction. For example, as illustrated in FIG. 9, two transmission portions TA may be arranged between two pixel groups Pg. According to some example embodiments, the transmission portion TA may be provided in an octagonal or circular shape by taking into account the diffraction characteristics of light. According to some example embodiments, the shape of the transmission portion TA may be implemented in the shape of the lower hole BSMH of the lower electrode layer BSM (see FIG. 6).

One pixel group Pg may include a first auxiliary sub-pixel Pa1, a second auxiliary sub-pixel Pa2, and a third auxiliary sub-pixel Pa3 that exhibit different colors. Therefore, one pixel group Pg may include three auxiliary sub-pixels.

The first auxiliary sub-pixel Pa1, the second auxiliary sub-pixel Pa2, and the third auxiliary sub-pixel Pa3 may each have a pixel arrangement structure arranged at the vertices of a virtual triangle VT. In this case, the first auxiliary sub-pixel Pa1 and the third auxiliary sub-pixel Pa3 may be arranged in a first row 1N, and the second auxiliary sub-pixel Pa2 may be arranged in a second row 2N.

The number of auxiliary sub-pixels Pa1, Pa2, and Pa3 included in a base unit U is 12, and the number of main sub-pixels Pm1, Pm2, and Pm3 included in a corresponding unit U' is 32. Therefore, the number of auxiliary sub-pixels Pa1, Pa2, and Pa3 and the number of main sub-pixels Pm1, Pm2, and Pm3 may be provided at a ratio of 3:8.

According to some example embodiments, the pixel group Pg and two transmission portions TA may be repeatedly arranged in the second display area DA2 in an x direction. In addition, the pixel group Pg and the transmission portion TA may be alternately arranged in a y direction. That is, the pixel group Pg may be distributed and arranged in the base unit U, thereby improving visibility.

In addition, such an arrangement may increase the sizes of the emission areas of the auxiliary sub-pixels Pa1, Pa2, and Pa3, thereby preventing the degradation of the auxiliary sub-pixels Pa1, Pa2, and Pa3 and implementing improved luminance.

Figure 10:
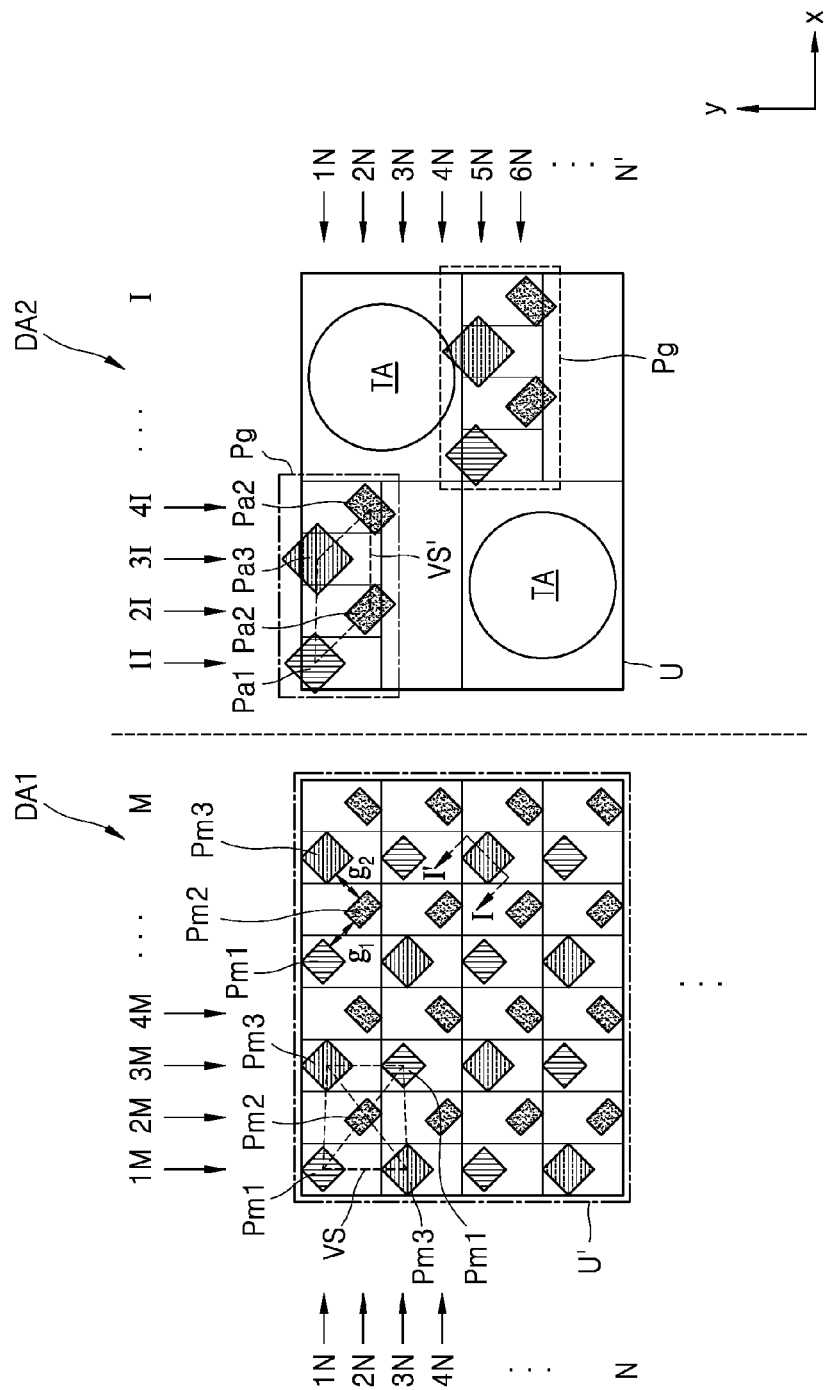
FIG. 10 is a schematic layout diagram illustrating the arrangement of sub-pixels and transmission portions, according to some example embodiments.

FIG. 10 is a schematic layout diagram of a pixel arrangement structure according to some example embodiments. In FIG. 10, the same reference numerals as those in FIG. 5 refer to the same members, and a redundant description thereof will be omitted.

Referring to FIG. 10, a pixel group Pg and a transmission portion TA arranged in a second display area DA2 may be alternately arranged in one direction (y direction). Auxiliary sub-pixels Pa1, Pa2, and Pa3 included in one pixel group Pg may have a pixel arrangement structure with two rows. In addition, the size of at least one of the auxiliary sub-pixels Pa1, Pa2, and Pa3 may be greater than the sizes of main sub-pixels Pm1, Pm2, and Pm3 that exhibit the same color.

According to some example embodiments, one pixel group Pg may include a first auxiliary sub-pixel Pa1, two second auxiliary sub-pixels Pa2, and a third auxiliary sub-pixel Pa3. Therefore, one pixel group Pg may include four auxiliary sub-pixels. The first auxiliary sub-pixel Pa1, the second auxiliary sub-pixel Pa2, and the third auxiliary sub-pixel Pa3 may implement different colors. For example, the first auxiliary sub-pixel Pa1, the second auxiliary sub-pixel Pa2, and the third auxiliary sub-pixel Pa3 may implement red, green, and blue colors, respectively.

Each of the four auxiliary sub-pixels Pa3 may have a pixel arrangement structure arranged at the vertices of a virtual rectangle VS'. According to some example embodiments, the virtual rectangle VS' may be a parallelogram. In this case, the first auxiliary sub-pixel Pa1 and the third auxiliary sub-pixel Pa3 may be arranged in a first row 1N, and the two second auxiliary sub-pixels Pa2 may be arranged in a second row 2N.

The number of auxiliary sub-pixels Pa1, Pa2, and Pa3 included in a base unit U is 8, and the number of main sub-pixels Pm1, Pm2, and Pm3 included in a corresponding unit U' is 32. Therefore, the number of auxiliary sub-pixels Pa1, Pa2, and Pa3 and the number of main sub-pixels Pm1, Pm2, and Pm3 may be provided at a ratio of 1:4.

According to some example embodiments, the pixel group Pg and one transmission portion TA may be alternately arranged in the second display area DA2 in an x direction and a y direction. Such a pixel arrangement structure is referred to as a ¼ pentile distribution structure. The pixel group Pg according to some example embodiments may be distributed and arranged in the base unit U, thereby improving visibility.

In addition, the auxiliary sub-pixels Pa1, Pa2, and Pa3 may be provided in two rows in the pixel group Pg, thereby facilitating the expansion of the emission area. That is, such an arrangement may increase the sizes of the emission areas of the auxiliary sub-pixels Pa1, Pa2, and Pa3, thereby preventing or reducing the degradation of the auxiliary sub-pixels Pa1, Pa2, and Pa3 and implementing improved luminance.

Figure 11:
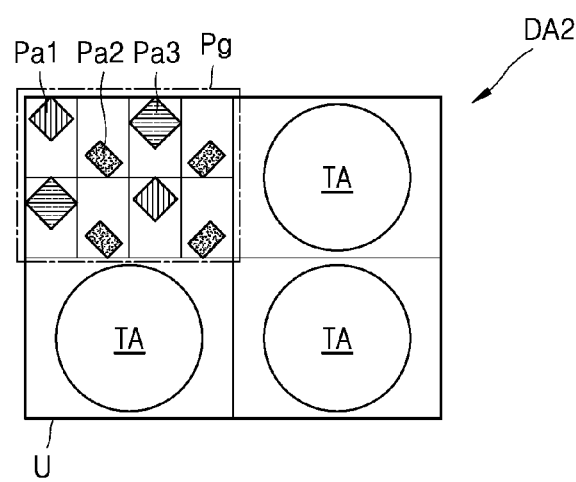
FIG. 11 is a schematic layout diagram illustrating the arrangement of sub-pixels and transmission portions, according to Comparative Example.

FIG. 11 illustrates Comparative Example for comparison with Examples and illustrates a case in which auxiliary sub-pixels are arranged in a ¼ pentile structure in a second display area DA2.

Referring to FIG. 11, in a display apparatus according to Comparative Example, eight auxiliary sub-pixels Pa1, Pa2, and Pa3 are arranged in one pixel group Pg, and four auxiliary sub-pixels Pa1, Pa2, and Pa3 in the pixel group Pg are arranged in four rows. In addition, only one pixel group Pg is arranged in a base unit U, and a transmission portion TA is arranged in the remaining area.

The number of auxiliary sub-pixels Pa1, Pa2, and Pa3 included in the base unit U is 8, and the number of main sub-pixels Pm1, Pm2, and Pm3 included in a corresponding unit U' is 32. Therefore, the number of auxiliary sub-pixels Pa1, Pa2, and Pa3 and the number of main sub-pixels Pm1, Pm2, and Pm3 may be provided at a ratio of 1:4. Such a pixel arrangement structure is referred to as a ¼ pentile structure.

Such a pixel arrangement structure may be advantageous in terms of securing the transmission portion TA. However, gaps between the auxiliary sub-pixels Pa1, Pa2, and Pa3 have to be maintained. Thus, it may be difficult to expand the size of each of the auxiliary sub-pixels Pa1, Pa2, and Pa3.

In addition, because the pixel group Pg implementing an image is biased to either side of the base unit U, it may be disadvantageous in terms of visibility.

FIG. 12 is a table showing visibility and lifespan according to Examples and Comparative Example.

Referring to FIG. 12, Example 1 is the embodiment of FIG. 5 in which the ⅜ pentile structure is employed in the second display area DA2 and the sizes of the auxiliary sub-pixels expand. Comparative Example is a case in which the ¼ pentile structure of FIG. 11 is employed and the sizes of the auxiliary sub-pixels are equal to the sizes of the main sub-pixels. Example 2 is the embodiment of FIG. 10 in which the ¼ pentile structure is employed and the sizes of the auxiliary sub-pixels expand.

As illustrated in FIG. 12, in Examples 1 and 2, the pixel group Pg including the auxiliary sub-pixels is distributed and arranged. Therefore, the image may be smoothly recognized, as compared with Comparative Example.

Furthermore, in Examples 1 and 2, since the sizes of the auxiliary sub-pixels are large, it may be seen that the lifespan of the display element is increased.

As described above, aspects of some example embodiments may have a pixel arrangement structure in which the size of the auxiliary sub-pixel included in the second display area is relatively easily adjusted, thereby providing the highly reliable display apparatus.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
a substrate;
a first display area at which a plurality of main sub-pixels are on the substrate; and
a second display area at which a base unit is on the substrate, the base unit comprising a plurality of pixel groups including auxiliary sub-pixels and transmission portions,
wherein the pixel groups and the transmission portions are alternately arranged along a first direction, and auxiliary sub-pixels included in one pixel group among the pixel groups are provided in two rows, and
a size of an emission area of a first auxiliary sub-pixel among the auxiliary sub-pixels is greater than a size of an emission area of a first main sub-pixel exhibiting a same color as that of the first auxiliary sub-pixel among the main sub-pixels, while gaps and relative positions between the auxiliary sub-pixels of the pixel groups of the second display area are equal to corresponding gaps and relative positions between corresponding groups of sub-pixels of the main sub-pixels.

2. The display apparatus of claim 1, wherein a number of the auxiliary sub-pixels included in the one pixel group among the pixel groups is three, and each of the auxiliary sub-pixels is arranged at a vertex of a virtual triangle.

3. The display apparatus of claim 1, wherein a number of the auxiliary sub-pixels included in the base unit is ⅜ of a number of the main sub-pixels included in a corresponding unit having a same area as that of the base unit in the first display area.

4. The display apparatus of claim 1, wherein the one pixel group and two of the transmission portions are arranged in a second direction intersecting the first direction.

5. The display apparatus of claim 1, wherein a number of the auxiliary sub-pixels included in the one pixel group among the pixel groups is four, and each of the auxiliary sub-pixels is arranged at a vertex of a virtual rectangle.

6. The display apparatus of claim 5, wherein the virtual rectangle is a parallelogram.

7. The display apparatus of claim 5, wherein a number of the auxiliary sub-pixels included in the base unit is ¼ of a number of the main sub-pixels included in a corresponding unit having a same area as that of the base unit in the first display area.

8. The display apparatus of claim 5, wherein the pixel groups are apart from each other in the base unit.

9. The display apparatus of claim 1, wherein the transmission portions each have a circular shape.

10. The display apparatus of claim 1, wherein opposite electrodes integrally provided in the main sub-pixels and the auxiliary sub-pixels are arranged in the first display area and the second display area, and the opposite electrodes each comprise an opening corresponding to one of the transmission portions.

11. The display apparatus of claim 1, further comprising an inorganic insulating layer on the substrate,
wherein the inorganic insulating layer comprises openings corresponding to the transmission portions.

12. The display apparatus of claim 1, further comprising a lower electrode layer between the substrate and the auxiliary sub-pixels,
wherein the lower electrode layer comprises lower holes corresponding to the transmission portions.

13. A display apparatus comprising:
a substrate comprising a first display area in which main sub-pixels are provided and a second display area in which a pixel group including auxiliary sub-pixels and a transmission portion are provided;
a first pixel electrode and a first emission layer, each configured to implement a first main sub-pixel among the main sub-pixels;
a second pixel electrode and a second emission layer, each configured to implement a first auxiliary sub-pixel exhibiting a same color as that of the first main sub-pixel among the auxiliary sub-pixels; and
an opposite electrode integrally arranged in the first display area and the second display area,
wherein the auxiliary sub-pixels included in the pixel group are provided in two rows, and
a size of an emission area of the first auxiliary sub-pixel is greater than a size of an emission area of the first main sub-pixel, while gaps and relative positions between the auxiliary sub-pixels of the pixel groups of the second display area are equal to corresponding gaps and relative positions between corresponding groups of sub-pixels of the main sub-pixels.

14. The display apparatus of claim 13, further comprising a functional layer arranged between the first pixel electrode and the opposite electrode,
wherein the functional layer is arranged to correspond to the transmission portion.

15. The display apparatus of claim 13, further comprising a lower electrode layer arranged between the substrate and the second pixel electrode,
wherein the lower electrode layer comprises lower holes corresponding to the transmission portion.

16. The display apparatus of claim 13, further comprising a pixel defining layer comprising a first opening and a second opening configured to expose central portions of the first pixel electrode and the second pixel electrode, respectively,
wherein the emission area of the first main sub-pixel is defined by the first opening, and the emission area of the first auxiliary sub-pixel is defined by the second opening.

17. The display apparatus of claim 13, further comprising an inorganic insulating layer arranged on the substrate,
wherein the inorganic insulating layer comprises openings corresponding to the transmission portion.

18. The display apparatus of claim 13, wherein the first display area and the second display area are sealed by an encapsulation substrate arranged to face the substrate.

19. The display apparatus of claim 13, further comprising a thin-film encapsulation layer comprising a first inorganic encapsulation layer, an organic encapsulation layer, and a second inorganic encapsulation layer, which are sequentially arranged on the opposite electrode.

20. The display apparatus of claim 13, further comprising an image sensor arranged below the second display area.

* * * * *